(12) United States Patent
Doi

(10) Patent No.: US 11,777,543 B2
(45) Date of Patent: *Oct. 3, 2023

(54) DISTORTION COMPENSATION APPARATUS AND DISTORTION COMPENSATION METHOD

(71) Applicant: NEC Corporation, Tokyo (JP)

(72) Inventor: Yoshiaki Doi, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/636,457

(22) PCT Filed: Mar. 18, 2021

(86) PCT No.: PCT/JP2021/011096
§ 371 (c)(1),
(2) Date: Feb. 18, 2022

(87) PCT Pub. No.: WO2021/229913
PCT Pub. Date: Nov. 18, 2021

(65) Prior Publication Data
US 2022/0311462 A1    Sep. 29, 2022

(30) Foreign Application Priority Data
May 12, 2020    (JP) ................. 2020-083960

(51) Int. Cl.
*H04B 1/04* (2006.01)

(52) U.S. Cl.
CPC ......... *H04B 1/0475* (2013.01); *H04B 1/0483* (2013.01); *H04B 2001/0425* (2013.01); *H04B 2001/0433* (2013.01)

(58) Field of Classification Search
CPC ............... H04B 1/0475; H04B 1/0483; H04B 2001/0425; H04B 2001/0433

(Continued)

(56) References Cited

U.S. PATENT DOCUMENTS 8,537,041 B2    9/2013   Chandrasekaran et al.
9,209,753 B2    12/2015  Xiao et al.
(Continued)

FOREIGN PATENT DOCUMENTS

| CN | 107895074 A   | 4/2018 |
| JP | 2019-125863 A | 7/2019 |
| WO | 2018/159021 A1 | 9/2018 |

OTHER PUBLICATIONS

Lei Guan et al ., "Low-Cost FPGA Implementation of Volterra Series-Based Digital Predistorter for RF Power Amplifiers", IEEE Transactions on Microwave Theory and Techniques, IEEE, USA, vol. 58, No. 4, Apr. 1, 2010, pp. 866-872. (Year: 2010).*

(Continued)

*Primary Examiner* — Kevin M Burd

(57) ABSTRACT

A DPD (1) includes: a polynomial structure including a pseudo-interpolation/sub-sample-shift processing unit (101) configured to operate at a sampling rate for sampling an input signal not upsampled in a previous stage of the DPD (1), pseudo-interpolate a sample point between sample points of the input signal, and shift the pseudo-interpolated sample point by a sub-sample and a multiplexer (109) configured to select a combination of a sub-sample shift amount; and an FIR filter (107) configured to be provided in a subsequent stage of the polynomial structure and include a sub-sample delay filter delaying a sample point of the input signal by a sub-sample. The DPD (1) compensates for distortion due to a sample point of the input signal and compensates for distortion due to a sub-sample point between sample points of the input signal for the DPD (1), by using the polynomial structure and the FIR filter (107).

6 Claims, 15 Drawing Sheets

(58) Field of Classification Search
USPC .......................................................... 375/297
See application file for complete search history.

(56) References Cited

U.S. PATENT DOCUMENTS

| | | | |
|---|---|---|---|
| 10,554,183 B2* | 2/2020 | Doi .................... | H03F 1/3282 |
| 2004/0232984 A1* | 11/2004 | Meade ................. | H03F 1/3247 |
| | | | 330/149 |
| 2019/0022217 A1 | 1/2019 | Doi | |
| 2019/0393842 A1 | 12/2019 | Mochida | |

OTHER PUBLICATIONS

Extended European Search Report for EP Application No. 21805228.0 dated Oct. 21, 2022.

Lei Guan et al., "Low-Cost FPGA Implementation of Volterra Series-Based Digital Predistorter for RF Power Amplifiers", IEEE Transactions On Microwave Theory and Techniques, IEEE, USA, vol. 58, No. 4, Apr. 1, 2010, pp. 866-872.

Li, Yue et al., "Instantaneous Sample Indexed Magnitude-Selective Affine Function-Based Behavioral Model for Digital Predistortion of RF Power Amplifiers", IEEE Transactions on Microwave Theory and Techniques, IEEE, USA, vol. 66, No. 11, Nov. 1, 2018, pp. 5000-5010.

International Search Report for PCT Application No. PCT/JP2021/011096, dated Jun. 1, 2021.

D. R. Morgan et al., "A Generalized Memory Polynomial Model for Digital Predistortion of RF Power Amplifiers", IEEE Transactions on Signal Processing, vol. 54, No. 10, Oct. 2006. pp. 3852-3860.

3GPP TR 38.803, 14.1.0 (Jun. 2017), Technical Report, "3rd Generation Partnership Project: Technical Specification Group 3 Rado Access Network; Study on new radio access technology: Radio Frequency (RF) and co-existence aspects". pp. 1-202.

V. Leung et al., "Improved Digital-IF Transmitter Architecture for Highly Integrated W-CDMA Mobile Terminals"; IEEE Transactions on Vehicular Technology, vol. 54, No. 1, Jan. 2005. pp. 20-32.

Y. Liu et al., "A New Digital Predistortion for Wideband Power Amplifiers With Constrained Feedback Bandwidth", IEEE Microwave and Wireless Components Letters, vol. 23, No. 12, Dec. 2013. pp. 683-685 —.

* cited by examiner

DISTORTION COMPENSATION APPARATUS AND DISTORTION COMPENSATION METHOD

This application is a National Stage Entry of PCT/JP2021/011096 filed on Mar. 18, 2021, which claims priority from Japanese Patent Application 2020-083960 filed on May 12, 2020, the contents of all of which are incorporated herein by reference, in their entirety.

TECHNICAL FIELD

The present disclosure relates to a distortion compensation apparatus and a distortion compensation method that compensate for distortion of a power amplifier in a transmission apparatus such as a base station used in a wireless communication system.

BACKGROUND ART

A transmission apparatus in a wireless communication system includes a power amplifier amplifying power of a transmission signal. While the power amplifier is required to operate in a region as close to saturation as possible for improvement of power efficiency, linearity of the power amplifier and power efficiency are in a trade-off relation. Thus, the transmission apparatus includes a distortion compensation apparatus in order to enhance linearity and power efficiency simultaneously. The distortion compensation apparatus is used for the purpose of suppressing non-linear distortion generated in the power amplifier during high-efficiency operation and reducing an adjacent channel leakage ratio (ACLR) due to non-linear distortion outside a carrier band (out-of-band) and error vector magnitude (EVM) due to non-linear distortion within the carrier band (in-band).

Schemes used in a distortion compensation apparatus include a digital predistortion (DPD) scheme. A DPD-based distortion compensation apparatus enhances linearity of an output signal of a power amplifier and thereby suppresses output distortion by previously adding a signal with an inverse characteristic of non-linear distortion of the power amplifier to an input signal of the power amplifier.

The output distortion of the power amplifier includes not only distortion due to memoryless non-linearity dependent only on an input signal at a certain time but also distortion due to a memory effect occurring due to bias current and an input signal at a timing shifted relative to the input signal at a certain time. Furthermore, the memory effect in the power amplifier becomes more noticeable as the bandwidth of the input signal increases, and performance of the DPD is thereby limited.

Examples of proposed specific signal processing performed by the DPD in order to compensate for distortion due to the aforementioned memory effect include inverse distortion generation processing based on a series-based scheme such as a Volterra series, a memory polynomial, and a generalized memory polynomial.

DPD based on the Volterra series has a problem that it is extremely difficult to implement the DPD on actual hardware since complexity of the DPD increases exponentially in some cases. Therefore, in order to overcome the problem, for example, Non Patent Literature 1 and Non Patent Literature 2 propose the memory polynomial structure and the generalized memory polynomial structure. The memory polynomial structure is a Volterra series simplified for the purpose of minimizing the number of coefficients in a trade-off relation with compensation performance. The generalized memory polynomial structure generalizes and extends a time shift amount of a memory effect term for an input signal at a certain time to a leading term in addition to a lagging term for improvement of performance of the memory polynomial structure.

A signal processing apparatus performing calculation equivalent to a power series by using a look up table (LUT) is generally proposed as hardware for providing the memory polynomial structure and the generalized memory polynomial structure. Further, for example, Non Patent Literature 2 proposes a generalized memory polynomial model representing a non-linear model of a specific power amplifier based on an actual measurement or a circuit simulation. However, the generalized memory polynomial model disclosed in Non Patent Literature 2 requires derivation of an inverse system for an extremely large number of non-linear model coefficients at a maximum of 8 (non-linear order: 0 to 7)×7 (memory order: 7)×2 (I-phase and Q-phase: 2)=112. Therefore, the generalized memory polynomial model disclosed in Non Patent Literature 2 has a first problem of the related art that an enormous amount of calculation is still required even when signal processing is performed based on a simplified generalized memory polynomial structure.

Next, a problem involved in changes in technology trends is described. In order to achieve high-capacity communication in a 5th generation (5G) wireless communication system, band widening by a factor of 5 to 20 compared with existing 4th generation (4G) is required even in standardization for prerelease 5G Phase 1 in the 3rd Generation Partnership Project (3GPP); and, in particular, 800 MHz is required as a maximum system bandwidth in the submillimeter wave/millimeter wave band.

In 5G Phase 1, it is agreed to aggregate carriers by intra-band contiguous carrier aggregation in order to achieve the system bandwidth of 800 MHz in the submillimeter wave/millimeter wave band. For example, aggregation of eight carriers each having a channel bandwidth (Ch BW) of 100 MHz with a sub-carrier spacing (SCS) of 60 kHz, the number of sub-carriers 1500 to 1584, and an FFT size of 2048 is considered. Alternatively, aggregation of four carriers each having a channel bandwidth of 200 MHz with a sub-carrier spacing of 60 kHz, the number of sub-carriers 3000 to 3168, and an FFT size of 2048 is considered. Further alternatively, aggregation of two carriers each having a channel bandwidth of 400 MHz with sub-carrier spacing of 120 kHz, the number of sub-carriers 3000 to 3168, and an FFT size of 4096 is considered. However, when the system bandwidth of 800 MHz is achieved by aggregating carriers by intra-band contiguous carrier aggregation as described above, operation at an extremely high sampling frequency of 983.04 MHz is required in order to process a baseband signal in the total bandwidth of 800 MHz after carrier aggregation even when distortion compensation is not performed.

For example, when the aforementioned baseband signal processing is achieved by a field programmable gate array (FPGA), a maximum operating frequency (referred to as Fmax.) exceeding 1 GHz in the FPGA is an anticipated value achieved by the next 7 nm or 5 nm process or later to be released in the future. Accordingly, under the condition of using an FPGA based on the current process, it is required to employ a two-phase poly-phase structure also in the operation at 983.04 MHz without performing the aforementioned distortion compensation and operate a chain of each phase at ½ of the aforementioned sampling frequency 983.04 MHz.

As a 5G standardization trend for the submillimeter wave/millimeter wave band, the 3GPP has introduced scales being an ACLR of a base station (BS) and an adjacent channel interference ratio (ACIR) based on adjacent channel selectivity (ACS) of user equipment (UE) in terms of adjacent channel interference; and as for an ACLR standard for a BS, the ACLR standard of a BS in frequency bands at 24 GHz or higher is relaxed to 28 dBc (for a 24.24 to 33.4 GHz band) and 26 dBc (for a 37 to 52.6 GHz band). Therefore, the system bandwidth of 800 MHz may be achieved without assuming distortion compensation exclusively for the ACLR standard based on non-linear distortion outside the carrier band (out-of-band) in the submillimeter wave/millimeter wave band.

However, an effect on error vector magnitude (EVM) remains in terms of non-linear distortion within a carrier band (in-band). Application of 256 quadrature amplitude modulation (QAM) to a down link (DL) and specification of the EVM standard 3.5% at the time of the application also in the frequency range 2 (FR2) in the submillimeter wave/millimeter wave band are under study toward Release-16 for next 5G Phase 2 in the 3GPP. In order to satisfy the EVM standard 3.5% for 256 QAM application including an effect of phase noise of a local (local oscillation) signal for a radio circuit in the submillimeter wave/millimeter wave band and EVM degradation involved in an effect of a peak factor suppression signal of a signal, approximately 40 dBc needs to be achieved as signal to noise ratio (SNR) allocation based on non-linear distortion within the carrier band. Therefore, distortion compensation for compensating for non-linear distortion within the carrier band is particularly required.

When distortion compensation is performed, k-th-order non-linearity generally generates a distortion component occupying a bandwidth k times a modulation bandwidth of an input signal (=a maximum frequency of an amplitude envelope change of the input signal). Therefore, DPD compensating for the distortion component across the entire bandwidth is required to operate at a sampling frequency k times the modulation bandwidth of the input signal. For example, an operating frequency (sampling frequency) of approximately 4 GHz is required of DPD compensating for up to fifth-order non-linearity for an input signal bandwidth of 800 MHz in the submillimeter wave/millimeter wave band. Further, even when compensation is limited to third-order or lower non-linearity, an operating frequency of approximately 2.4 GHz is required of the DPD. Therefore, there is a second problem of the related art that the system requirement for the operating frequency of DPD exceeds a performance trend of an actually provided device.

Next, specific problems of the related art are described with reference to drawings.

FIG. 2 is a block diagram illustrating a configuration of a distortion compensation apparatus according to the related art in a transmission apparatus.

As illustrated in FIG. 2, the distortion compensation apparatus includes a digital predistorter (DPD) 1, a digital/analog (DA) converter 2, a transmission upconverter 3, a power amplifier 4, a directional coupler 5, a feedback downconverter 6, an analog/digital (AD) converter 7, and an interpolation circuit 8.

An input signal (baseband signal) x(n) of the distortion compensation apparatus is upsampled by the interpolation circuit 8 in a previous stage of the DPD 1, and upsampled $x_u(n)$ is input to the DPD 1. The upsampling by the interpolation circuit 8 increases a sampling rate (sampling frequency) of the input signal x(n) and expands the bandwidth of a digital signal for distortion compensation in the DPD 1. Setting of the ratio of the operating frequency (sampling frequency) of the DPD 1 to the modulation bandwidth of the input signal x(n) is determined by a multiplying factor of the upsampling by the interpolation circuit 8.

Upsampling an input signal to a DPD in a previous stage of the DPD and inputting the upsampled signal to the DPD is a technology described in, for example, Patent Literatures 1 and 2. A distortion compensation apparatus upsampling an input signal of a DPD in a previous stage of the DPD is hereinafter referred to as an upsampling distortion compensation apparatus as appropriate. Further, a DPD to which an upsampled input signal is input in a previous stage thereof in an upsampling distortion compensation apparatus is referred to as an upsampling DPD as appropriate.

For example, it is assumed that $x_u(n)$ acquired by twofold-upsampling, by the interpolation circuit 8, a sampling frequency of 983.04 MHz required for processing an input signal x(n) with a bandwidth of 800 MHz in the aforementioned submillimeter wave/millimeter wave band is input to the DPD 1. In this case, the operating frequency of the DPD 1, that is, the bandwidth of a digital signal for distortion compensation is 1.96608 GHz being 2.4576 times the bandwidth 800 MHz of the input signal x(n).

The DPD 1 performs processing (distortion compensation processing) of generating $y_u(n)$ by previously adding a signal with an inverse characteristic of non-linear distortion of the power amplifier 4 to input upsampled $x_u(n)$ and outputs generated $y_u(n)$ to the DA converter 2. Details of the DPD 1 are described later.

The DA converter 2 DA converts the output signal $y_u(n)$ of the DPD 1 from a digital signal into an analog signal and outputs the DA converted analog signal to the transmission upconverter 3.

The transmission upconverter 3 upconverts an analog signal from the DA converter 2 into a radio frequency (RF) signal and outputs the upconverted RF signal to the power amplifier 4.

The directional coupler 5 feeds back part of an RF signal being amplified by and being output from the power amplifier 4 and outputs the signal as a feedback RF signal for output observation. The feedback RF signal acquired by the directional coupler 5 is fed back to the DPD 1 through the feedback downconverter 6 and the analog/digital (AD) converter 7.

The feedback downconverter 6 downconverts a feedback RF signal from the directional coupler 5 and outputs the downconverted signal to the AD converter 7.

The AD converter 7 AD converts a signal from the feedback downconverter 6 from an analog signal into a digital signal and feeds back the AD converted digital signal to the DPD 1 as a feedback signal $z_u(n)$.

The DPD 1 performs the aforementioned distortion compensation processing by using a feedback signal $z_u(n)$ from the AD converter 7. Specifically, the DPD 1 includes an LUT and updates the LUT according to the feedback signal $z_u(n)$. Then, in the aforementioned distortion compensation processing, the DPD 1 calculates a signal with an inverse characteristic of non-linear distortion of the power amplifier 4 by using the updated LUT and generates $y_u(n)$ by adding the calculated signal to $x_u(n)$. Details of the LUT are described later.

In recent years, an interpolation DAC is used as the DA converter 2 in FIG. 2 (the DA converter 2 is hereinafter referred to as an interpolation DA converter 2 as appropriate) for the purpose of eliminating the need for compensation for a DC offset resulting from imperfection of an analog quadrature modulator and an image caused by a quadrature error, and simplifying a radio circuit. The interpolation DA converter is a DA converter incorporating an interpolation function and a digital quadrature modulator function.

The aforementioned interpolation DA converter is used not only for the purpose of achieving the aforementioned digital quadrature modulation but also as a DA converter even when the digital quadrature modulation is not performed. For example, the aforementioned interpolation DA converter can relax required performance of an analog filter required for an output part of a DA converter and is generally used not only as a discrete DA converter but also as a DA converter incorporated in an application-specific general-purpose IC requiring miniaturization and integration, for the purpose of performing over sampling providing a miniaturization effect.

For example, the aforementioned digital quadrature modulation scheme is a technology described in Non Patent Literature 3.

FIG. 3 is a block diagram illustrating a functional example of the interpolation DA converter 2.

The interpolation DA converter 2 is configured to provide the digital quadrature modulation function as follows. First, the interpolation DA converter 2 is operated at a sampling clock rate four times the sampling frequency of input I- and Q-signals, and each of the input I- and Q-signals is fourfold interpolated. A complex multiplier 206 complex-multiplies the fourfold-interpolated I-signal by an I-phase sine signal (such as 0, 1, 0, −1, 0, . . . ) from a numerical controlled oscillator (NCO) 205. Further, a complex multiplier 207 complex-multiplies the fourfold-interpolated Q-signal by a Q-phase cosine signal (such as 1, 0, −1, 0, 1, . . . ) from the NCO 205. Then, a digital quadrature modulated signal is acquired by adding the signals complex-multiplied by the complex multipliers 206 and 207, respectively, by an adder 208. Then, the digital quadrature modulated signal is converted into an analog signal by one (single-channel) DA conversion unit 209. Thus, a quadrature modulated real intermediate frequency (IF) signal at an IF frequency ¼ of the sampling clock rate of the interpolation DA converter 2 is output.

The interpolation DA converter 2 is configured to provide a fourfold interpolation function by connecting two twofold interpolation circuits each zero-stuffing an input signal and then eliminating an image by an interpolation half-band filter.

The aforementioned half-band filter is used for twofold interpolation or decimation to half in an application for processing a multirate signal. About half of coefficients of the aforementioned half-band filter are equal to zero, and therefore the half-band filter is implemented in a poly-phase form.

The interpolation DA converter 2 incorporates, as twofold interpolation circuits in an initial stage (first stage), a half-band filter$_1$ 201 and a half-band filter$_1$ 202 for initial-stage twofold interpolation and incorporates, as twofold interpolation circuits in a subsequent stage (second stage), a half-band filter$_2$ 203 and a half-band filter$_2$ 204 for subsequent-stage fourfold interpolation. Each of the half-band filters is an interpolation half-band filter with an 80% Nyquist passband. Each of the half-band filter$_1$ 201 and the half-band filter$_1$ 202 for initial-stage twofold interpolation is generally a finite impulse response (FIR) filter with 59 taps or so, and each of the half-band filter$_2$ 203 and the half-band filter$_2$ 204 for subsequent-stage fourfold interpolation is an FIR filter with 23 taps or so.

By employment of the interpolation DA converter 2, the transmission upconverter 3 in a subsequent stage of the interpolation DA converter 2 has only to convert a real IF signal output from the interpolation DA converter 2 into an RF signal, and an analog quadrature modulator is not required. Accordingly, employment of the interpolation DA converter 2 produces an effect that the radio circuit can be simplified and, furthermore, that processing of compensating for a DC offset resulting from imperfection of an analog quadrature modulator and an image due to a quadrature error can be deleted.

It is assumed in the distortion compensation apparatus according to the related art illustrated in FIG. 2 that the interpolation circuit 8 is deleted and upsampling for the DPD 1 is not performed for the purpose of reducing the operating frequency of the DPD 1 itself in order to address the aforementioned second problem related to device performance. With this configuration, for example, the operating frequency of the DPD 1 for the input signal bandwidth of 800 MHz in the submillimeter wave/millimeter wave band remains 983.04 MHz being required for processing the input signal x(n) with the 800 MHz bandwidth and being merely 1.2288 times the bandwidth of the input signal x(n), as illustrated in FIG. 6 (details thereof are described later).

Next, difficulty in providing the configuration assumed above in which the interpolation circuit 8 is deleted is described with reference to the related art for comparison.

An AD converter generally has a relatively lower sampling rate than that of a DA converter and is rate-limiting in terms of performance. Then, for example, Non Patent Literature 4 proposes a DPD scheme that can narrow the bandwidth of a feedback path in which an AD converter is placed in order to relax a requirement for the AD converter for the purpose of cost reduction of a distortion compensation apparatus.

Non Patent Literature 4 proposes a DPD scheme that can reduce the sampling frequency of an AD converter for a feedback path to 368.64 MHz by limiting the bandwidth of a feedback signal for output observation of a power amplifier to 100 MHz by a band-pass filter (BPF) for an input signal with a modulation bandwidth of 100 MHz, as illustrated in FIG. 1. However, the technology disclosed in Non Patent Literature 4 operates the DPD at a sampling frequency 3.68 times the bandwidth of the input signal.

On the other hand, for example, Patent Literature 1 proposes a band-limited Volterra series-based DPD scheme as a means for reducing sampling frequencies of an AD converter for a feedback path, a DA converter for transmission, and a DPD for the purpose of additional cost reduction of a distortion compensation apparatus.

In the technology disclosed in Patent Literature 1, a distortion compensation signal is generated for an input signal with a modulation bandwidth of 100 MHz by a DPD based on a band-limited Volterra series model. Further, distortion outside the band of a filter bandwidth-limiting the distortion compensation signal generated by the DPD is suppressed by a BPF according to the related art placed in an output part of a power amplifier. Patent Literature 1 proposes a DPD scheme that can reduce the sampling frequency of the DPD from 500 MHz according to the related art to 200 MHz with this configuration. However, the technology disclosed in Patent Literature 1 operates the DPD at a sampling frequency twice the bandwidth of the input signal.

In the technology disclosed in Patent Literature 1, a non-linear processing unit is provided in a previous stage of a bandwidth limitation unit bandwidth-limiting the distortion compensation signal within a pre-set bandwidth. The non-linear processing unit needs to generate higher order non-linear distortion and a higher order memory effect for compensation that are not yet limited and are to be output within the bandwidth after bandwidth limitation, based on a Volterra series parameter. Therefore, while the sampling frequency of hardware is reduced to 200 MHz in the non-linear processing unit, high-speed operation is required of a calculation processor in the non-linear processing unit (although not being explicitly described in Patent Literature 1). For example, it is assumed that higher order non-linear distortion and a higher order memory effect for compensation equalizing compensation performance within the limited bandwidth with that at the 500 MHz sampling according to the related art are generated. In this case, a non-linearity processing calculation processor provided by a microprocessor such as a CPU or an embedded processor is required to operate at a frequency five times the bandwidth of the input signal.

In addition, Patent Literature 2 proposes a DPD subsystem that can improve a distortion compensation characteristic without increasing sampling rates of an AD converter for a feedback path and a DA converter for transmission relative to the related art.

In the technology disclosed in Patent Literature 2, a DPD subsystem includes a DPD main body, an interpolation circuit placed in a previous stage of the DPD main body as a pre-DPD processor, and a decimation circuit placed in a subsequent stage of the DPD main body as a post-DPD processor. This configuration allows sampling rates at the input and the output of the DPD subsystem to be not apparently changed from those according to the related art and allows sampling rates of an AD converter for a feedback path and a DA converter for transmission to be identical to those according to the related art. However, in practice, an interpolation circuit is provided in the DPD subsystem, as described above. Therefore, the technology disclosed in Patent Literature 2 is nothing other than a technology for operating the DPD main body at a sampling frequency twice the rate of the input signal even when an interpolation ratio L takes a minimum value of 2.

Further, the technology disclosed in Patent Literature 2 can be considered as a bandwidth-limiting DPD in which the interpolation circuit and the decimation circuit based on hardware substitute for the processing performed by the non-linearity processing calculation processor disclosed in Patent Literature 1 in order to perform bandwidth limitation after the aforementioned higher order non-linear distortion and higher order memory effect for compensation in the technology disclosed in Patent Literature 1 are generated.

As described above, for example, in order to perform distortion compensation on an input signal (baseband) with an 800 MHz bandwidth in the aforementioned submillimeter wave/millimeter wave band, 1.6 GHz being twice the bandwidth 800 MHz of the input signal is required as an operating frequency of the DPD even in the technology disclosed in Patent Literature 1. Further, 1.966 GHz being the bandwidth 800 MHz of an input signal×2.4576 (=input signal rate 983.04 MHz×2) is required as an operating frequency of the DPD in the technology disclosed in Patent Literature 2.

Next, in order to illustrate distortion compensation performance of the related art as a reference, a distortion compensation characteristic of the upsampling distortion compensation apparatus illustrated in FIG. 2 including a twofold interpolation circuit 8 in a previous stage of the DPD 1 for an input signal (=input signal rate 983.04 MHz) with a 800 MHz bandwidth in the aforementioned submillimeter wave/millimeter wave band is described by using a non-linear model of a specific power amplifier.

The input signal (baseband signal) x(n) of the distortion compensation apparatus illustrated in FIG. 2 is upsampled in the previous stage of the DPD 1 by the interpolation circuit 8, and upsampled $x_u(n)$ is input to the DPD 1. The upsampling by the interpolation circuit 8 increases the sampling rate (sampling frequency) of the input signal x(n) and expands a digital signal bandwidth for distortion compensation in the DPD 1. An upsampling ratio by the interpolation circuit 8 is assumed to be 2, and the operating frequency of the DPD 1 is assumed to be the input signal rate 983.04 MHz×=1.96608 GHz. The operating frequency of the DPD 1 at this time is equal to 2.4576 times the bandwidth 800 MHz of the input signal x(n).

The DPD 1 generates $y_u(n)$ by previously adding a signal with an inverse characteristic of non-linear distortion of the power amplifier 4 to input upsampled $x_u(n)$.

When a generalized memory polynomial structure is applied in the DPD 1, the output signal $y_u(n)$ of the DPD 1 is a result of calculating the following equation (1) for the upsampled input signal $x_u(n)$ of the DPD 1.

$$y_u(n) = \sum_{l=-\frac{L-1}{2}}^{+\frac{L-1}{2}} \sum_{k=0}^{K-1} x_u(n-l) \cdot a_{l,k} \cdot |x_u(n-l)|^k \qquad (1)$$

A time shift amount l of a memory effect term in the equation (1) is a time shift amount in the unit of a sampling cycle (=1/sampling frequency) (in other words, a sample shift amount) in the output signal $y_u(n)$ of the DPD 1. Furthermore, the aforementioned time shift amount for an input signal at a certain sampling timing is generalized and extended to a leading term in addition to a lagging term in a generalized memory polynomial. Therefore, l may take a value from $$-\frac{L-1}{2}$$

to $$+\frac{L-1}{2}.$$

Note that L is referred to as a memory order or the number of memory taps. Therefore, the time shift amount l of the aforementioned memory effect term is hereinafter referred to as a memory tap for convenience.

When a power series calculation for each term of the memory tap l in the aforementioned equation (1)

$$\sum_{k=0}^{K-1} a_{l,k} \cdot |x_u(n-l)|^k$$

is achieved by a power series function $$K_l(|x_u(n-l)|)$$

for an amplitude of the memory tap l for each term based on a look up table (LUT) as hardware instead of a direct calculation by a calculation processor, the equation (1) can be expressed by the following equation (2).

$$y_u(n) = \sum_{l=-\frac{L-1}{2}}^{+\frac{L-1}{2}} \sum_{k=0}^{K-1} x_u(n-l) \cdot a_{l,k} \cdot |x_u(n-l)|^k = \sum_{l=-\frac{L-1}{2}}^{+\frac{L-1}{2}} x_u(n-l) \cdot K_l(|x_u(n-l)|) \quad (2)$$

In a term at l=0 in the equation (2), the time shift amount of the output signal of the DPD 1 relative to the input signal of the DPD 1 is zero. Therefore, a polynomial at l=0 corresponds to a memoryless polynomial.

By specifically giving L=7 to the aforementioned equation (2) and further making a substitution of l=$l_s$−3 for the time shift amount l, the equation (2) can be expressed by the following equation (3).

$$y_u(n) = \sum_{l=-3}^{+3} x_u(n-l) \cdot K_l(|x_u(n-l)|) = \sum_{l_S=0}^{6} x_u(n+3-l_S) \cdot K_{l_S}(|x_u(n+3-l_S)|) \quad (3)$$

By delaying n in the aforementioned equation (3) by three samples, the equation can be expressed by the following equation (4).

$$y_u(n-3) = \sum_{l_S=0}^{6} x_u(n-l_S) \cdot K_{l_S}(|x_u(n-l_S)|) \quad (4)$$

Note that the time shift amount of the output signal of the DPD 1 relative to the input signal of the DPD 1 is zero in terms at $l_s$=3 (that is, l=0) in the equation (3) and the equation (4). Therefore, a polynomial at $l_s$=3 corresponds to a memoryless polynomial.

FIG. 4 illustrates a block diagram when calculation of the aforementioned equation (4) in the DPD 1 according to the related art is performed by, for example, a hardware function.

The DPD 1 in FIG. 4 performs calculation of the aforementioned equation (4). The DPD 1 in FIG. 4 includes 1-sample delay devices 301*a*, 301*b*, 301*c*, 301*d*, 301*e*, and 301*f*, amplitude address calculation circuits 302*a*, 302*b*, 302*c*, 302*d*, 302*e*, 302*f*, and 302*g*, look up tables (LUTs) 303*a*, 303*b*, 303*c*, 303*d*, 303*e*, 303*f*, and 303*g*, complex multipliers 304*a*, 304*b*, 304*c*, 304*d*, 304*e*, 304*f*, and 304*g*, and an adder 305. Detailed description of FIG. 4 is omitted.

When the equation (4) and the configuration in FIG. 4 are applied, assuming a non-linear order to be 0 to 7 and a memory order (the number of memory taps) to be 7, it is required to derive an inverse system for 8×7×2=112 non-linear model coefficients as (I-phase and Q-phase) complex coefficients.

In order to reduce the number of coefficients in addressing the first problem of the aforementioned related art that an enormous amount of calculation is required, a technique for expressing a seventh-order memory polynomial model providing the aforementioned equation (4) and FIG. 4 by an approximation model based on a combination of a three-tap polynomial and a five-tap FIR filter is introduced.

There is no example of the technique based on the approximation model disclosed in a literature or the like related to the related art. However, the technique based on the approximation model can be considered as an extended configuration of a related art based on a Wiener-Hammerstein model illustrated in FIG. 2(*c*) in Non Patent Literature 1, the configuration including three pieces of the model connected in parallel.

The aforementioned equation (2) is transformed into an approximation model based on a combination of a polynomial with a reduced number of coefficients and an FIR filter and is expressed by the following equation (5). It is assumed that L (memory order) is reduced from 7 given in the aforementioned equation (3) before reduction in the number of coefficients.

$$y_u(n) = \sum_{l=-\frac{L-1}{2}}^{+\frac{L-1}{2}} \sum_{r=-\frac{R-1}{2}}^{+\frac{R-1}{2}} W_{l,r} \cdot x_u(n-l-r) \cdot K_l(|x_u(n-l-r)|) \quad (5)$$

Similarly to the aforementioned equation (2), the time shift amount of the output signal of the DPD 1 relative to the input signal of the DPD 1 is zero in a term at l=0 and r=0 in the equation (5). Therefore, a polynomial at l=0 and r=0 corresponds to a memoryless polynomial.

When L=3 taps and R=5 taps are given to the aforementioned equation (5) in order to specifically reduce the number of coefficients, the equation (5) can be expressed by the following equation (6).

$$y_u(n) = \sum_{l=-1}^{+1} \sum_{r=-2}^{+2} W_{l,r} \cdot x_u(n-l-r) \cdot K_l(|x_u(n-l-r)|) \quad (6)$$

Furthermore, by making a substitution of l=$l_s$−1 on the time shift amount l and a substitution of r=$r_s$−2 on r, the equation (6) can be expressed by the following equation (7).

$$y_u(n) = \sum_{l_S=0}^{2} \sum_{r_S=0}^{4} W_{l_S,r_S} \cdot x_u(n+3-l_S-r_S) \cdot K_{l_S}(|x_u(n+3-l_S-r_S)|) \quad (7)$$

By delaying n in the equation (7) by three samples, the equation can be expressed by the following equation (8).

$$y_u(n-3) = \sum_{l_S=0}^{2} \sum_{r_S=0}^{4} W_{l_S,r_S} \cdot x_u(n-l_S-r_S) \cdot K_{l_S}(|x_u(n-l_S-r_S)|) \quad (8)$$

Note that the time shift amount of the output signal of the DPD 1 relative to the input signal of the DPD 1 is zero in a term at $l_s$=1 (that is, l=0) and $r_s$=2 (that is, r=0) in the equation (7) and the equation (8). Therefore, a polynomial at $l_s$=1 and r=2 corresponds to a memoryless polynomial.

FIG. 5 illustrates a block diagram when calculation of the aforementioned equation (8) in the DPD 1 with a reduced number of coefficients is configured by, for example, a hardware function.

The DPD 1 in FIG. 5 performs calculation of the aforementioned equation (8). The DPD 1 in FIG. 5 includes 1-sample delay devices 401*a* and 401*b*, amplitude address calculation circuits 402*a*, 402*b*, and 402*c*, LUTs 403*a*, 403*b*, and 403*c*, complex multipliers 404*a*, 404*b*, and 404*c*, an FIR filter₀ 405*a*, an FIR filter₁ 405*b*, an FIR filter₂ 405*c*, and an adder 406. Furthermore, each of the FIR filter₀ 405*a*, the FIR filter$_1$ 405b, and the FIR filter$_2$ 405c includes 1-sample delay devices 411a, 411b, 411c, and 411d, complex multipliers 412a, 412b, 412c, 412d, and 412e, and an adder 413.

For simplification of description, a polynomial $$x_u(n-l_s) \cdot K_{l_s}(|x_u(n-l_s)|)$$

with a reduced number of coefficients at the outputs of the complex multipliers 404a, 404b, and 404c for each term of a memory tap $l_s$ in the aforementioned equation (8) is substituted by a function $d_u(n-l_s)$ as expressed in the following equation (9) in FIG. 5.

$$x_u(n-l_s) \cdot K_{l_s}(|x_u(n-l_s)|) = d_u(n-l_s) \quad (9)$$

From an upsampled input signal $x_u(n)$ of the DPD 1 at a certain sampling timing, the 1-sample delay devices 401a and 401b generate $x_u(n)$, $x_u(n-1)$, and $x_u(n-2)$ delayed in steps of one sample. For the signals $x_u(n)$, $x_u(n-1)$, and $x_u(n-2)$ delayed in steps of one sample, the amplitude address calculation circuits 402a, 402b, and 402c calculate LUT amplitude addresses corresponding to amplitudes $|x_u(n)|$, $|x_u(n-1)|$, and $|x_u(n-2)|$ of the signals, respectively. The LUTs 403a, 403b, and 403c are referred to based on the LUT amplitude address for each signal delayed in steps of one sample, and an output signal of each LUT related to the LUT amplitude address is acquired. Then, the complex multipliers 404a, 404b, and 404c complex-multiply the output signals of the LUTs by the signals each delayed in steps of one sample. Each result of complex-multiplication by the complex multipliers 404a, 404b, and 404c is input to each of the FIR filter$_0$ 405a, the FIR filter$_1$ 405b, and the FIR filter$_2$ 405c as a polynomial $d_u(n-l_s)$ with a reduced number of coefficients for each term of the memory tap $l_s$=0, 1, or 2. The FIR filter$_0$ 405a is related to the memory tap $l_s$=0. The FIR filter$_1$ 405b is related to the memory tap $l_s$=1. The FIR filter$_2$ 405c is related to the memory tap $l_s$=2.

In each of the FIR filter$_0$ 405a, FIR filter$_1$ 405b, and FIR filter$_2$ 405c, the 1-sample delay devices 411a, 411b, 411c, and 411d generate $d_u(n-l_s)$, $d_u(n-l_s-1)$, $d_u(n-l_s,-2)$, $d_u(n-l_s,-4)$, and $d_u(n-l_s,-4)$ delayed in steps of one sample from input $d_u(n-l_s)$. The complex multipliers 412a, 412b, 412c, 412d, and 412e complex-multiply the signals delayed in steps of one sample by filter (complex) coefficients $W_{l_s,0}$, $W_{l_s,1}$, $W_{l_s,2}$, $W_{l_s,3}$, and $W_{l_s,4}$ related to FIR taps $r_s$=0, 1, 2, 3, and 4, respectively. Subsequently, the signals complex-multiplied by the complex multipliers 412a, 412b, 412c, 412d, and 412e are added by the adder 413. The signal added by the adder 413 is output from each of the FIR filter$_0$ 405a, the FIR filter$_1$ 405b, and the FIR filter$_2$ 405c as $$\sum_{r_S=0}^{4} W_{l_S,r_S} \cdot d_u(n-l_S-r_S)$$

for each memory tap $l_s$.

The output signal of the FIR filter$_0$ 405a related to the memory tap $l_s$=0 is as follows.

$$\sum_{r_S=0}^{4} W_{0,r_S} \cdot d_u(n-r_S)$$

The output signal of the FIR filter$_1$ 405b related to the memory tap $l_s$=1 is as follows.

$$\sum_{r_S=0}^{4} W_{1,r_S} \cdot d_u(n-r_S)$$

The output signal of the FIR filter$_2$ 405c related to the memory tap $l_s$=2 is as follows.

$$\sum_{r_S=0}^{4} W_{2,r_S} \cdot d_u(n-2-r_S)$$

The output signals of the FIR filter$_0$ 405a, the FIR filter$_1$ 405b, and the FIR filter$_2$ 405c are eventually added by the adder 406 and the added signal is output from the DPD 1 as the polynomial with a reduced number of coefficients expressed by the aforementioned equation (8).

Assuming the non-linear order to be 0 to 7, the memory order (the number of memory taps) to be 3, and the number of FIR taps to be 5 when the equation (8) and the configuration in FIG. 5 are applied, an inverse system for (8+5)× 3×2=78 non-linear model coefficients may be derived as (I-phase and Q-phase) complex coefficients. Therefore, a 30% reduction in the number of coefficients can be achieved compared with the case of applying the aforementioned equation (4) and the configuration in FIG. 4 (the number of coefficients being 112).

The (8×3×2=48) power series coefficients and the (5×3× 2=30) tap coefficients of the FIR filter$_0$ 405a, the FIR filter$_1$ 405b, and the FIR filter$_2$ 405c in the LUTs 403a, 403b, and 403c are derived as follows. Specifically, the power series coefficients and the tap coefficients in the LUTs 403a, 403b, and 403c are derived by performing adaptive control with the ratio of the root mean square error (RMSE) between N samples of feedback signals $z_u(n)$ and input signals $x_u(n)$ of a reference DPD 1 to the root mean square (RMS) value of the N samples of input signals $x_u(n)$ as an error evaluation function.

The aforementioned error evaluation function is a normalized root mean square error (NRMSE) as indicated in the following equation (10) and is equivalent to error vector magnitude (EVM) of the feedback signal $z_u(n)$ for $x_u(n)$.

$$NRMSE = 20 \cdot \log_{10}\left(\frac{\sqrt{\frac{\sum_{n=1}^{N}|z_u(n) - x_u(n)|^2}{N}}}{\sqrt{\frac{\sum_{n=1}^{N}|x_u(n)|^2}{N}}}\right) = 10 \cdot \log_{10}\left(\frac{\sum_{n=1}^{N}|z_u(n) - x_u(n)|^2}{\sum_{n=1}^{N}|x_u(n)|^2}\right) \quad (10)$$

CITATION LIST

Patent Literature

Patent Literature 1: U.S. Pat. No. 9,209,753
Patent Literature 2: U.S. Pat. No. 8,537,041

Patent Literature 3: Japanese Unexamined Patent Application Publication No. 2019-125863

Non Patent Literature

Non Patent Literature 1: D. R. Morgan, Z. Ma, J. Kim, M. G. Zierdt, and J. Pastalan, "A Generalized Memory Polynomial Model for Digital Predistortion of RF Power Amplifiers," IEEE Transactions on Signal Processing, vol. 54, no. 10, pp. 3852-3860, October 2006

Non Patent Literature 2: 3GPP TR 38.803, V14.1.0 (2017-06), Technical Report, "3rd Generation Partnership Project; Technical Specification Group Radio Access Network; Study on new radio access technology: Radio Frequency (RF) and co-existence aspects," Annex A: PA models v Non Patent Literature 3: V. Leung, and L. Larson, "Improved Digital-IF Transmitter Architecture for Highly Integrated W-CDMA Mobile Terminals," IEEE Transactions on Vehicular Technology, vol. 54, no. 1, pp. 20-32, January 2005

Non Patent Literature 4: Y. Liu, W. Pan, S. Shao, and Y. Tang, "A New Digital Predistortion for Wideband Power Amplifiers With Constrained Feedback Bandwidth," IEEE Microwave and Wireless Components Letters, vol. 23, no. 12, pp. 683-685, December 2013

SUMMARY OF INVENTION

Technical Problem

As described above, in order to reduce the number of coefficients for addressing the first problem of the related art that an enormous amount of calculation is required, introduction of an upsampling distortion compensation apparatus based on an interpolation circuit to which the aforementioned equation (8) and the configuration in FIG. 5 are applied is considered. The upsampling distortion compensation apparatus based on the interpolation circuit can achieve a 30% reduction in the number of coefficients compared with a DPD to which the aforementioned equation (4) and the configuration in FIG. 4 according to the related art are applied.

However, twofold-upsampling to 1.96608 GHz is performed by the interpolation circuit 8 in the previous stage of the DPD 1 in the upsampling distortion compensation apparatus based on the interpolation circuit to which the aforementioned equation (8) and the configuration in FIG. 5 are applied, and therefore the system requirement for the operating frequency of the DPD 1 exceeds the performance trend of an actually provided device, as described above. Therefore, the aforementioned second problem remains unsolved.

FIG. 6 is a block diagram of a distortion compensation apparatus in which the interpolation circuit 8 illustrated in FIG. 2 is deleted and DPD upsampling is not performed in order to address the second problem of the related art related to device performance in the distortion compensation apparatus.

A difference between FIG. 6 and previously described FIG. 2 in terms of configuration is that, with deletion of the interpolation circuit 8, an input signal x(n) not undergoing DPD upsampling directly becomes an input signal of the DPD 1. Further, another difference between FIG. 6 and FIG. 2 in terms of configuration is that while the DPD 1 generates and outputs y(n) acquired by previously adding a signal with an inverse characteristic of non-linear distortion of the power amplifier 4 to input x(n), the sampling frequencies of the output signal y(n) and the input signal x(n) of the DPD 1 are identical.

Since DPD upsampling is not performed in the case of the configuration illustrated in FIG. 6, the operating frequency of the DPD 1 for a 800 MHz bandwidth of the input signal x(n) in the aforementioned submillimeter wave/millimeter wave band is 983.04 MHz required for processing a baseband input signal in the 800 MHz bandwidth. Therefore, the ratio of the operating frequency of the DPD 1 to the bandwidth of the input signal x(n) is 1.2288, which is less than that of the related art wherein the ratio of the operating frequency of the DPD 1 to the bandwidth of the input signal x(n) is two.

Next, a problem of the distortion compensation apparatus with the configuration in FIG. 6 in which the interpolation circuit 8 is deleted and DPD upsampling is not performed is described.

The input signal x(n) with an 800 MHz bandwidth and the output signal y(n) of the DPD 1 in FIG. 6 are signals sampled at a sampling frequency of 983.04 MHz. The maximum frequency of an amplitude envelope change in the input signal x(n) with a modulation bandwidth of 800 MHz is 800 MHz. However, when the maximum frequency of an amplitude envelope change in the input signal x(n) is close to the sampling frequency, there is a problem that a change in an amplitude envelope of a signal interpolated by the interpolation DA converter 2 deviates from a change in an amplitude envelope of the signal before interpolation.

FIG. 7 illustrates a comparison between amplitude changes of a signal with an 800 MHz bandwidth at a sampling frequency 983.04 MHz before interpolation and amplitude changes of the signal after the signal is twofold-upsampled at a sampling frequency 1.96608 GHz by twofold interpolation processing. The aforementioned twofold interpolation processing is processing performed by the initial-stage twofold interpolation circuit zero-stuffing an input signal and then eliminating an image by the interpolation half-band filter in the aforementioned interpolation DA converter 2 illustrated in FIG. 3.

A sample point interpolated in a sample spacing of a signal before interpolation is generated by the aforementioned twofold interpolation. However, samples causing considerable deviation between an amplitude envelope change between samples in the signal before the interpolation and an amplitude envelope change of the signal after the twofold interpolation exist (samples causing considerable deviation are surrounded by double broken lines in FIG. 7).

Next, FIG. 8 illustrates a comparison between amplitude changes of a signal twofold-upsampled at a sampling frequency 1.96608 GHz by the aforementioned twofold interpolation processing and amplitude changes of the signal fourfold-upsampled at a sampling frequency 3.93216 GHz by further performing the twofold interpolation processing on the signal. Note that the twofold interpolation processing added for the aforementioned fourfold-upsampling is processing performed by the twofold interpolation circuit in the subsequent stage in the aforementioned interpolation DA converter 2 illustrated in FIG. 3.

There is no big difference between the amplitude envelope changes of the signal after twofold interpolation and the amplitude envelope changes of the signal after fourfold interpolation.

The above tells that when the maximum frequency of an amplitude envelope change is close to the sampling frequency (for example, the ratio of the sampling frequency to the bandwidth of the input signal is less than 2), an amplitude envelope change of the interpolated signal deviates from an amplitude envelope change of the signal before the interpolation.

As described above, when the interpolation circuit is deleted and DPD upsampling is not performed, a problem that deviation in amplitude envelope change occurs between a signal interpolated by the interpolation DA converter 2 in the subsequent stage of the DPD 1 and a signal before interpolation processed by the DPD 1 is observed. The problem does not need to be considered in the distortion compensation apparatus in which an upsampling DPD 1 based on interpolation according to the related art is employed and twofold or higher upsampling is performed in the previous stage of the DPD 1 and is a problem to be solved unique to the distortion compensation apparatus in which DPD upsampling is not performed.

In FIG. 6, the DPD 1 generates the output signal y(n) of the DPD 1 at a sampling frequency of 983.04 MHz by the input signal x(n) and the feedback signal z(n) at the same sampling frequency. However, an envelope of a modulated signal input to the power amplifier 4 is equal to an envelope of a modulated signal converted into an analog signal after y(n) is interpolated by the interpolation DA converter 2. Therefore, in compensation for distortion generated in the power amplifier 4, a sample point interpolated by the interpolation DA converter 2 needs to be taken into consideration particularly for compensation for a memory effect affected by samples before and after a certain sample point. However, the interpolated sample point is a sub-sample point interpolated between sample points for the DPD 1 operating at a sampling rate before the interpolation and therefore cannot be reflected in a distortion compensation signal for compensation for the memory effect.

The aforementioned problem is specifically described. A memory tap in the equation (8) and the configuration in FIG. 5 performing the aforementioned twofold-DPD upsampling indicates a sample shift amount in the unit of the sampling cycle (=1/sampling frequency) after twofold-upsampling at 1.96608 GHz in the previous stage of the DPD 1. Accordingly, for example, a memory tap $l_s=1$ in the aforementioned equation (8) is a memory tap of a sub-sample corresponding to a memory tap=0.5 for the DPD 1 operating at a sampling frequency 983.04 MHz in the configuration illustrated in FIG. 6 in which the interpolation circuit is deleted and DPD upsampling is not performed. Therefore, the memory tap $l_s=1$ is not handled as a memory tap by the DPD 1 operating at the sampling frequency 983.04 MHz and therefore cannot be reflected in a distortion compensation signal for compensation for the memory effect.

As described above, when a configuration in which the interpolation circuit in the previous stage of the DPD is deleted and DPD upsampling is not performed is applied, and the DPD is operated at a sampling frequency 1.2288 times the input signal bandwidth 800 MHz, it is difficult to achieve target compensation performance by the DPD and the distortion compensation apparatus according to the related art.

Thus, a technology allowing compensation for a memory effect within a carrier band caused by a sub-sample memory tap between sample points in a DPD is proposed in Patent Literature 3. The technology disclosed in Patent Literature 3 is described below with reference to drawings.

FIG. 9 illustrates a block diagram of a configuration example of a DPD 1 disclosed in Patent Literature 3. The DPD 1 according to Patent Literature 3 corresponds to the DPD 1 in the distortion compensation apparatus illustrated in FIG. 6. As described above, the distortion compensation apparatus illustrated in FIG. 6 has a configuration in which the interpolation circuit 8 in FIG. 2 is deleted and DPD upsampling is not performed, in order to address the aforementioned second problem of the related art related to device performance in the distortion compensation apparatus.

First, an outline of the DPD 1 according to Patent Literature 3 is described.

As described above, the distortion compensation apparatus illustrated in FIG. 6 does not perform DPD upsampling processing in the previous stage of the DPD 1 and operates at a non-upsampled and low sampling rate. When the following (A) and (B) are achieved, even the distortion compensation apparatus illustrated in FIG. 6 can compensate for a memory effect caused by a sub-sample memory tap between sample points in the DPD 1 generated by the interpolation DA converter 2 in the subsequent stage of the DPD 1.

(A) Generating a signal corresponding to the twofold-upsampled signal $x_u(n-l_s)$ in the aforementioned equation (8) and FIG. 5 in which the number of coefficients is reduced, from a sample signal sequence of non-upsampled input signals of the DPD 1.

(B) Providing, without twofold-upsampling, an FIR filter equivalent to the FIR filter$_0$ 405a, the FIR filter$_1$ 405b, and the FIR filter$_2$ 405c illustrated in FIG. 5 operating at the twofold sampling frequency.

In the following equation (11), a signal being generated from a sample signal sequence of non-upsampled input signals of the DPD 1 by pseudo-interpolation and a sub-sample shift and corresponding to twofold-upsampled $x_u(n-l_s)$ in the aforementioned equation (8) is denoted by a pseudo-interpolation signal $x_u'(n-l_s)$. Further, in the following equation (11), a signal being generated by this $x_u'(n-l_s)$ and a sub-sample FIR filter including a sub-sample delay tap and corresponding to the twofold-upsampled $y_u(n-3)$ acquired in the aforementioned equation (8) is denoted by $y_u'(n-3)$. Furthermore, in the following equation (11), $x_u(n-l_s-r_s)$ in the aforementioned equation (8) is substituted by $x_u'(n-l_s-r_s)$, and $y_u(n-3)$ is substituted by $y_u'(n-3)$. A means for achieving the following equation (11) without twofold-upsampling is described below.

$$y_u'(n-3) = \sum_{l_s=0}^{2} \sum_{r_s=0}^{4} W_{l_s,r_s} \cdot x_u'(n-l_s-r_s) \cdot K_{l_s}(|x_u'(n-l_s-r_s)|) \quad (11)$$

Memory taps $l_s$ are 0, +1, and +2, and FIR taps $r_s$ are 0, +1, +2, +3, and +4 in the equation (11); and each tap represents a twofold-upsampled sample shift amount. Accordingly, the aforementioned memory taps correspond to sub-sample shifts of 0, +0.5, and +1, and the aforementioned FIR taps correspond to sub-sample shifts of 0, +0.5, +1, +1.5, and +2 for the DPD 1 operating at a non-upsampled sampling rate.

First, a means for generating $x_u'(n-l_s)$ corresponding to the memory taps $l_s=0$, +1, and +2 at the FIR tap $r_s=0$ in the aforementioned equation (11) from a sample signal sequence of non-upsampled input signals of the DPD 1 is described.

FIG. 10 illustrates an example of tap coefficients of a twofold-interpolation half-band FIR filter incorporated in the interpolation DA converter 2.

It is assumed that the center tap of the half-band FIR filter is the i-th tap, the number of taps is (2i−1), and tap coefficients are $C_1, C_2, \ldots, C_{i-1}, C_i, C_{i+1}, \ldots,$ and $C_{2i-1}$.

As described above, about half of the tap coefficients of the half-band FIR filter are equal to zero, and the filter is generally configured with 59 taps or so. For simplification of illustration and description, FIG. 10 illustrates only 11 taps including the center tap and the center tap ±5 taps.

FIG. 11 illustrates a timing chart illustrating the twofold interpolation processing in the interpolation DA converter 2.

For example, assuming a signal before interpolation to be an input signal x(n), the twofold interpolation processing is processing of performing zero-stuffing between samplings of the input signal x(n), then eliminating an image through the twofold-interpolation half-band FIR filter illustrated in FIG. 10, and acquiring a twofold-interpolated output signal $x_u(n)$.

As described above, the twofold interpolation processing is processing of performing zero-stuffing between samplings before interpolation and then make the signal pass through the half-band FIR filter. Therefore, in derivation of a twofold-interpolated sample $x_u(n)$ at a certain sampling timing n at which a sample before interpolation exists, only the center tap coefficient C of the aforementioned twofold-interpolation half-band FIR filter is an effective coefficient for a sample signal sequence before the interpolation. Therefore, $x_u(n)$ can be expressed by the following equation (12) for the sample signal sequence before the interpolation.

$$x_u(n) = C_i \cdot x(n) \tag{12}$$

Next, unlike the aforementioned sampling timing n, a sampling timing n+1 after the twofold interpolation is a sampling timing at which a sample before the interpolation does not exist. Therefore, in derivation of $x_u(n+1)$ at the sampling timing n+1, only i taps other than the center tap and zero-coefficient taps out of (2i−1) taps of the aforementioned twofold-interpolation half-band FIR filter are effective coefficients for the sample signal sequence before the interpolation. Therefore, for example, by using tap coefficients of the 11 taps simplified for the sake of description in FIG. 10 and FIG. 11, $x_u(n+1)$ can be expressed by the following equation (13) for the sample signal sequence before the interpolation.

$$x_u(n+1) = C_{i-5} \cdot x(n-2) + C_{i-3} \cdot x(n-1) + C_{i-1} \cdot x(n) + C_{i-1} \cdot x(n+1) + C_{i+3} \cdot x(n+2) + C_{i+5} \cdot x(n+3) \tag{13}$$

Furthermore, unlike the aforementioned sampling timing n, a sampling timing n−1 after the twofold interpolation is also a sampling timing at which a sample before the interpolation does not exist. Therefore, in derivation of $x_u(n-1)$ at the sampling timing n−1, only i taps other than the center tap and the zero-coefficient taps out of the (2i−1) taps of the aforementioned twofold-interpolation half-band FIR filter are effective coefficients for the sample signal sequence before the interpolation. Therefore, for example, by using tap coefficients of the 11 taps simplified for the sake of description in FIG. 10 and FIG. 11, $x_u(n-1)$ can be expressed by the following equation (14) for the sample signal sequence before the interpolation.

$$x_u(n-1) = C_{i-5} \cdot x(n-3) + C_{i-3} \cdot x(n-2) + C_{i-1} \cdot x(n-1) + C_{i+1} \cdot x(n) + C_{i+3} \cdot x(n+1) + C_{i+5} \cdot x(n+2) \tag{14}$$

Next, FIG. 12 illustrates a procedure for acquiring tap coefficients of a pseudo-interpolation filter (corresponding to pseudo-interpolation/sub-sample-shift filters 101a and 101b in FIG. 9) for acquiring sub-sample memory taps=±0.5 for the DPD 1 operating at a non-upsampled sampling rate, the tap coefficients being indicated in the aforementioned equation (13) and equation (14).

The purpose of acquiring tap coefficients of the aforementioned pseudo-interpolation filters is not actually performing the twofold interpolation processing illustrated in FIG. 11 on the example of tap coefficients of the twofold-interpolation half-band FIR filter illustrated in FIG. 10. The purpose of acquiring tap coefficients of the aforementioned pseudo-interpolation filters is acquiring effective coefficients multiplied by a sample signal sequence of input signals of the DPD 1 before interpolation at a sampling timing before the interpolation in order to acquire sub-sample memory taps=±0.5 for the DPD 1 operating at a non-upsampled sampling rate.

At a sampling timing at which a sample before interpolation exists, every coefficient is normalized by the center tap coefficient $C_i$ in such a way that $x_u(n)=x(n)$ (in other words, $C_i=1.0$) in the aforementioned equation (12) holds, and then the center tap and zero-coefficient taps are removed. Thus, effective coefficients of i taps to be multiplied at the sampling timing before the interpolation are acquired. The acquired effective coefficients are tap coefficients of an i-tap pseudo-interpolation filter for acquiring sub-sample memory taps=±0.5 for the DPD 1 operating at the non-upsampled sampling rate.

Accordingly, by normalizing every coefficient in the aforementioned equation (13) by the center tap coefficient $C_i$, a pseudo-interpolation signal $x_u'(n+1)$ can be expressed by the following equation (15). Furthermore, by normalizing every coefficient in the aforementioned equation (14) by the center tap coefficient $C_i$, a pseudo-interpolation signal $x_u'(n-1)$ can be expressed by the following equation (16).

$$x_u'(n+1) = \frac{C_{i-5}}{C_i} \cdot x(n-2) + \frac{C_{i-3}}{C_i} \cdot x(n-1) + \frac{C_{i-1}}{C_i} \cdot x(n) + \frac{C_{i+1}}{C_i} \cdot x(n+1) + \frac{C_{i+3}}{C_i} \cdot x(n+2) + \frac{C_{i+5}}{C_i} \cdot x(n+3) \tag{15}$$

$$x_u'(n-1) = \frac{C_{i-5}}{C_i} \cdot x(n-3) + \frac{C_{i-3}}{C_i} \cdot x(n-2) + \frac{C_{i-1}}{C_i} \cdot x(n-1) + \frac{C_{i+1}}{C_i} \cdot x(n) + \frac{C_{i+3}}{C_i} \cdot x(n+1) + \frac{C_{i+5}}{C_i} \cdot x(n+2) \tag{16}$$

A processing delay of the aforementioned i-tap pseudo-interpolation filter is (i−1) samples in sampling after twofold interpolation, that is, (i/2−0.5) converted to sampling in the DPD 1 operating at the non-upsampled sampling rate. Therefore, when i/2 samples are delayed relative to the input in sampling in the DPD 1 in a path related to a sub-sample memory tap=0 in which the aforementioned pseudo-interpolation filter is not placed, the aforementioned pseudo-interpolation filter in a path in which the aforementioned pseudo-interpolation filter is placed is a pseudo-interpolation/sub-sample-shift filter (corresponding to a pseudo-interpolation/sub-sample-shift filter 101a in FIG. 9) for acquiring a sub-sample memory tap ahead of the aforementioned path related to the sub-sample memory tap=0 by 0.5 samples, that is, a sub-sample memory tap=−0.5 for the DPD 1. Further, when the aforementioned pseudo-interpolation filter is placed after one sample is delayed relative to the input in sampling in the DPD 1, the aforementioned pseudo-interpolation filter placed after the aforementioned 1-sample delay is a pseudo-interpolation/sub-sample-shift filter (corresponding to a pseudo-interpolation/sub-sample-shift filter 101b in FIG. 9) for acquiring a sub-sample memory tap behind the aforementioned path related to the sub-sample memory tap=0 by 0.5 samples, that is, a sub-sample memory tap=+0.5 for the DPD.

Note that the aforementioned pseudo-interpolation/sub-sample-shift filter has a configuration in which an I-phase tap coefficient and a Q-phase tap coefficient are identical and complex-multiplication is not required.

From the above, sub-sample memory taps=±0.5 for the DPD 1 operating at the non-upsampled sampling rate are acquired in each path in which the aforementioned pseudo-interpolation/sub-sample-shift filter is placed. Further, sub-sample memory taps corresponding to −0.5, 0, and +0.5 can be provided by including a path related to the sub-sample memory tap=0 in which the aforementioned pseudo-interpolation/sub-sample-shift filter is not placed. The sub-sample memory taps corresponding to −0.5, 0, and +0.5 correspond to the memory taps l=−1, 0, and +1 after twofold-upsampling in the aforementioned equation (6). Therefore, by making a substitution of $1=l_s-1$ for the time shift amount l, similarly to substitutions from the aforementioned equation (6) to the aforementioned equation (7) and the aforementioned equation (8), $x_u'(n-l_s)$ corresponding to the memory taps $l_s=0, +1$, and $+2$ in the aforementioned equation (11) is acquired.

Note that i denoting the number of taps of the aforementioned pseudo-interpolation/sub-sample-shift filter is an example of the number of taps assumed for (2i−1) taps of the twofold-interpolation half-band FIR filter in the interpolation DA converter 2 but is not restrictive. As described above, when a common twofold-interpolation half-band FIR filter has 59 taps, i=30 according to the aforementioned example. However, in practice, the number of taps i of the aforementioned pseudo-interpolation/sub-sample-shift filter may be decreased without affecting performance, for the purpose of reducing the circuit size of the aforementioned pseudo-interpolation/sub-sample-shift filter.

Second, a means for acquiring sub-sample FIR taps=0, +0.5, +1, +1.5, and +2 in the aforementioned equation (11) in sampling in the DPD 1 operating at a non-upsampled sampling rate is described.

FIG. 13A illustrates an impulse response example of a 0.5-sample delay filter in a case of a delay being a non-integer relative to a sample, for example, the delay being 0.5 samples.

When a delay τ is a non-integer relative to a sample, an impulse response s(n) is an infinite impulse response (IIR) instead of a finite impulse response (FIR), as indicated in the following equation (17).

$$s(n) = \frac{\sin \pi(n - \tau)}{\pi(n - \tau)} \quad (17)$$

Accordingly, in terms of practical implementation, the circuit size of a filter is reduced by limiting the number of taps to a finite number of taps j. When the number of taps of a sub-sample delay IIR filter is limited, an intra-passband ripple occurs. In order to suppress the intra-passband ripple, processing of multiplication by a window function centered on the delayed point is required. However, the processing involves a narrowed passband, and therefore there is a trade-off relation between the number of taps and a characteristic.

FIG. 13B illustrates a frequency characteristic of an amount of filter attenuation for the number of taps j when a 0.5-sample delay filter is configured with an FIR filter by limiting the number of tap coefficients to a finite number and performing multiplication by a window function.

A sub-sample delay filter (corresponding to a sub-sample delay filter 111 in FIG. 9) is a filter for distortion compensation within the aforementioned 800 MHz carrier bandwidth. Therefore, when an amount of attenuation at a one-side 400 MHz offset point is to be suppressed to 0.5 dB or less, an example of the number of taps j required for the sub-sample delay filter is 14 taps or more.

However, unlike the aforementioned pseudo-interpolation/sub-sample-shift filter, the sub-sample delay filter is a filter simply giving a sub-sample delay. Therefore, when one j-tap 0.5-sample delay filter is provided in one path, a 1.5-sample delay is achievable by placing a 1-sample delay device in a subsequent stage of the 0.5-sample delay filter.

A processing delay of the aforementioned j-tap sub-sample delay filter is (j−1) samples in sampling after twofold interpolation, that is, (j/2−0.5) converted to sampling in the DPD 1 operating at the non-upsampled sampling rate. Therefore, when (j/2−1) samples are delayed relative to an input of the FIR filter in sampling in the DPD 1 in a path in which the aforementioned sub-sample delay filter is not placed, a signal passing through the aforementioned sub-sample delay filter is a signal delayed by 0.5 samples relative to the signal delayed by (j/2−1) samples. Therefore, the aforementioned sub-sample delay filter is a sub-sample delay filter for acquiring a sub-sample FIR tap=+0.5 for the DPD 1.

Note that the aforementioned sub-sample delay filter has a configuration in which an I-phase tap coefficient and a Q-phase tap coefficient are identical and complex-multiplication is not required.

In a path in which the aforementioned sub-sample delay filter is placed, a signal delayed by 0.5 samples relative to the aforementioned signal delayed by (j/2−1) samples by the aforementioned sub-sample delay filter and a signal delayed by 1.5 samples by further delaying the signal delayed by 0.5 samples by one sample in sampling in the DPD 1 is output. On the other hand, in a path in which the aforementioned sub-sample delay filter is not placed, a signal delayed by (j/2−1) samples in sampling in the DPD 1 and signals further delayed by one sample and two samples relative to the signal, respectively, in sampling in the DPD 1 is output. Thus, signals with amounts of delay in sampling in the DPD 1 being 0 samples, 0.5 samples, one sample, 1.5 samples, and two samples relative to the aforementioned signal delayed by (j/2−1) samples can be acquired, and as a result, five taps being sub-sample FIR taps=0, +0.5, +1, +1.5, and +2 can be provided. With the five taps, an FIR filter corresponding to the FIR taps $r_s=0, +1, +2, +3$, and +4 and operating at a twofold sampling frequency can be provided without twofold-upsampling.

As described above, a signal corresponding to the aforementioned equation (11) can be provided by a polynomial structure with a reduced number of coefficients including a pseudo-interpolation/sub-sample-shift filter and a sub-sample FIR filter including a sub-sample delay filter.

In practice, with addition of the aforementioned pseudo-interpolation/sub-sample-shift filter and the aforementioned sub-sample delay filter, a total amount of delay being (i−1)+(j−2) samples is a processing delay of the input signal of the DPD 1 also added at $l_s=0$ and $r_s=0$ for a certain sampling timing n, the total amount of delay being acquired by adding (i−1) samples being an amount of delay of the aforementioned pseudo-interpolation/sub-sample-shift filter in sampling after twofold interpolation and (j−2) samples being an amount of delay in sampling after twofold interpolation converted from a delay of (j/2−1) samples in sampling in the DPD 1 added to a path in which the aforementioned sub-sample delay filter is not placed. Therefore, the aforementioned equation (11) becomes the following equation (18).

$$y'_u(n-3-(i-1)-(j-2)) = \sum_{l_s=0}^{2}\sum_{r_s=0}^{4} W_{l_s,r_s} \cdot x'_u(n-l_s-r_s-(i-1)-(j-2)) \cdot K_{l_s}(|x'_u(n-l_s-r_s-(i-1)-(j-2))|) \tag{18}$$

By further simplifying the equation (18), the following equation (19) is acquired.

$$y'_u(n-i-j) = \sum_{l_s=0}^{2}\sum_{r_s=0}^{4} W_{l_s,r_s} \cdot x'_u(n+3-i-j-l_s-r_s) \cdot K_{l_s}(|x'_u(n+3-i-j-l_s-r_s)|) \tag{19}$$

Specifically, the calculation corresponding to the equation (19) in which a substitution of a twofold-upsampling rate is made can be achieved by calculating the following equation (20) at a sampling rate of the DPD 1 operating at a non-twofold-upsampled sampling rate.

$$y\left(n-\frac{i}{2}-\frac{j}{2}\right) = \sum_{l_s=0}^{2}\sum_{r_s=0}^{4} W_{l_s,r_s} \cdot x\left(n+\frac{3-i-j-l_s-r_s}{2}\right) \cdot K_{l_s}\left(\left|x\left(n+\frac{3-i-j-l_s-r_s}{2}\right)\right|\right) \tag{20}$$

A polynomial at $l_s=1$ and $r_s=2$ at which the time shift amount of the output signal of the DPD 1 relative to the input signal of the DPD 1 is zero corresponds to a memoryless polynomial also in the equation (20), similarly to the aforementioned equation (8).

As described above, it is confirmed that the aforementioned equation (20) can be achieved without twofold-upsampling from a sample signal sequence of non-upsampled input signals of the DPD 1 by a polynomial structure including the aforementioned pseudo-interpolation/sub-sample-shift filter and an FIR filter including the aforementioned sub-sample delay filter.

The DPD 1 according to Patent Literature 3 illustrated in FIG. 9 includes a polynomial structure including the aforementioned pseudo-interpolation/sub-sample-shift filter and an FIR filter being placed in a subsequent stage of the polynomial structure and including the aforementioned sub-sample delay filter. The configuration, practicability thereof being confirmed above, achieves the aforementioned equation (20) without twofold-upsampling from a sample signal sequence of non-upsampled input signals of the DPD 1.

FIG. 9 described above illustrates a configuration example of the DPD 1 according to Patent Literature 3 in a case of the calculation of the aforementioned equation (20) being configured by, for example, a hardware function. The DPD 1 according to Patent Literature 3 illustrated in FIG. 9 is specifically described below.

As described above, the DPD 1 according to Patent Literature 3 illustrated in FIG. 9 corresponds to the DPD 1 in the distortion compensation apparatus illustrated in FIG. 6. FIG. 6 illustrates a configuration example of the distortion compensation apparatus proposed in the present example embodiment. As described above, the distortion compensation apparatus illustrated in FIG. 6 has a configuration in which the interpolation circuit 8 illustrated in FIG. 2 is deleted and DPD upsampling is not performed, in order to address the aforementioned second problem of the related art related to device performance of the distortion compensation apparatus.

The DPD 1 according to Patent Literature 3 illustrated in FIG. 9 includes the pseudo-interpolation/sub-sample-shift filters 101a and 101b each configured with an i-tap FIR filter and also includes an i/2-sample delay device 102, a 1-sample delay device 103, amplitude address calculation circuits 104a, 104b, and 104c, LUTs 105a, 105b, and 105c, complex multipliers 106a, 106b, and 106c, an FIR filter$_0$ 107a, an FIR filter$_1$ 107b, an FIR filter$_2$ 107c, and an adder 108. Furthermore, each of the FIR filter$_0$ 107a, the FIR filter$_1$ 107b, and the FIR filter$_2$ 107c includes a sub-sample delay filter 111 configured with an j-tap FIR filter and also includes a (j/2−1)-sample delay device 112, 1-sample delay devices 113a, 113b, and 113c, complex multipliers 114a, 114b, 114c, 114d, and 114e, and an adder 115.

In the DPD 1 according to Patent Literature 3 illustrated in FIG. 9, three paths (first paths) are branched in parallel from an input stage of the DPD 1, and the pseudo-interpolation/sub-sample-shift filter 101a, the i/2-sample delay device 102, and the pseudo-interpolation/sub-sample-shift filter 101b are placed in the three paths, respectively.

Each of the pseudo-interpolation/sub-sample-shift filters 101a and 101b pseudo-interpolates a sub-sample point between sample points of a signal input to the filter and shifts the pseudo-interpolated sub-sample point by a sub-sample; and each filter is an example of a pseudo-interpolation/sub-sample-shift processing unit. The i/2-sample delay device 102 delays a sample point of a signal input to the device by i/2 samples and is an example of a first delay device.

The amplitude address calculation circuit 104a, the LUT 105a, the complex multiplier 106a, and the FIR filter$_0$ 107a are placed in a subsequent stage of the pseudo-interpolation/sub-sample-shift filter 101a. The amplitude address calculation circuit 104b, the LUT 105b, the complex multiplier 106b, and the FIR filter$_1$ 107b are placed in a subsequent stage of the i/2-sample delay device 102. The 1-sample delay device 103 is placed in a previous stage of the pseudo-interpolation/sub-sample-shift filter 101b, and the amplitude address calculation circuit 104c, the LUT 105c, the complex multiplier 106c, and the FIR filter$_2$ 107c are placed in a subsequent stage of the pseudo-interpolation/sub-sample-shift filter 101b. The 1-sample delay device 103 delays a sample point of a signal input to the device by one sample. Furthermore, the adder 108 is placed in a subsequent stage of the FIR filter$_0$ 107a, the FIR filter$_1$ 107b, and the FIR filter$_2$ 107c. The adder 108 is an example of a first adder. For example, a polynomial structure is defined as a structure from the beginning to the complex multiplier 106a in a path in which the pseudo-interpolation/sub-sample-shift filter 101a is placed. The same applies to other paths.

In each of the FIR filter$_0$ 107a, the FIR filter$_1$ 107b, and the FIR filter$_2$ 107c, two paths (second paths) are branched in parallel from an input stage of the FIR filter, and the sub-sample delay filter 111 and the (j/2−1)-sample delay device 112 are placed in the two paths, respectively.

The sub-sample delay filter 111 delays a sample point of a signal input to the filter by a sub-sample. The (j/2−1)- sample delay device 112 delays a sample point of a signal input to the device by (j/2−1) samples and is an example of a second delay device.

The 1-sample delay devices 113a and 113b connected in series are placed in a subsequent stage of the (j/2−1)-sample delay device 112. Further, the 1-sample delay device 113a is placed in parallel with the complex multiplier 114a in a subsequent stage of the (j/2−1)-sample delay device 112, the 1-sample delay device 113b is placed in parallel with the complex multiplier 114b in a subsequent stage of the 1-sample delay device 113a, and the complex multiplier 114c is placed in a subsequent stage of the 1-sample delay device 113b. The 1-sample delay device 113c is placed in a subsequent stage of the sub-sample delay filter 111. Further, the 1-sample delay device 113c is placed in parallel with the complex multiplier 114d in a subsequent stage of the sub-sample delay filter 111, and the complex multiplier 114e is placed in a subsequent stage of the 1-sample delay device 113c. Each of the 1-sample delay devices 113a, 113b, and 113c delays a sample point of a signal input to the device by one sample.

Furthermore, the adder 115 is placed in a subsequent stage of the complex multipliers 114a, 114b, 114c, 114d, and 114e. The adder 115 is an example of a second adder.

The sample amount of each delay described above is a value at the sampling rate of the DPD 1 operating at a non-upsampled sampling rate.

Further, in FIG. 9, for simplification of description, a polynomial $$x\left(n-\frac{i}{2}+\frac{1}{2}-\frac{l_s}{2}\right) \cdot K_{l_s}\left(\left|x\left(n-\frac{i}{2}+\frac{1}{2}-\frac{l_s}{2}\right)\right|\right)$$

at each output of the complex multipliers 106a, 106b, and 106c for each term of the memory tap $l_s$ in the aforementioned equation (20) is substituted by a function $$d\left(n-\frac{i}{2}+\frac{1}{2}-\frac{l_s}{2}\right)$$

as expressed by the following equation (21).

$$x\left(n-\frac{i}{2}+\frac{1}{2}-\frac{l_s}{2}\right) \cdot K_{l_s}\left(\left|x\left(n-\frac{i}{2}+\frac{1}{2}-\frac{l_s}{2}\right)\right|\right) = d\left(n-\frac{i}{2}+\frac{1}{2}-\frac{l_s}{2}\right) \quad (21)$$

The operation of the DPD 1 according to Patent Literature 3 illustrated in FIG. 9 is described below.

The pseudo-interpolation/sub-sample-shift filter 101a generates $$x\left(n-\frac{i}{2}+\frac{1}{2}\right)$$

at the sampling rate of the DPD 1, the signal corresponding to a twofold-interpolated signal $x_u'(n-i+1)$ delayed by (i−1) samples in sampling after twofold interpolation, from an input signal x(n) of the DPD 1 at a certain sampling timing.

Further, the i/2-sample delay device 102 generates $$x\left(n-\frac{i}{2}\right)$$

at the sampling rate of the DPD 1, the signal corresponding to a signal $x_u'(n-i)$ delayed by i samples (=i/2×2 samples) in sampling after twofold interpolation.

Furthermore, the 1-sample delay device 103 and the pseudo-interpolation/sub-sample-shift filter 101b generate $$x\left(n-\frac{i}{2}-\frac{1}{2}\right)$$

at the sampling rate of the DPD 1, the signal corresponding to a twofold-interpolated signal $x_u'(n-i-1)$ delayed by (i+1) samples in sampling after twofold interpolation.

Thus, each signal $$x\left(n-\frac{i}{2}+\frac{1}{2}\right), x\left(n-\frac{i}{2}\right), x\left(n-\frac{i}{2}-\frac{1}{2}\right)$$

corresponding to delaying in steps of one sample in sampling after twofold interpolation is generated.

With regard to the aforementioned signals, the amplitude address calculation circuits 104a, 104b, and 104c calculate LUT amplitude addresses corresponding to amplitudes $$\left|x\left(n-\frac{i}{2}+\frac{1}{2}\right)\right|, \left|x\left(n-\frac{i}{2}\right)\right|, \left|x\left(n-\frac{i}{2}-\frac{1}{2}\right)\right|$$

of the signals, respectively.

The LUT 105a, 105b, or 105c is referred to based on a LUT amplitude address for a signal corresponding to delaying in steps of one sample in sampling after the aforementioned twofold interpolation, and an output signal of each LUT related to the LUT amplitude address is acquired. Then, the complex multipliers 106a, 106b, and 106c complex-multiply output signals of the LUTs by signals correspond to delaying in steps of one sample in sampling after the aforementioned twofold interpolation, respectively. The results of the complex-multiplication by the complex multipliers 106a, 106b, and 106c are input to the FIR filter$_0$ 107a, the FIR filter$_1$ 107b, and the FIR filter$_2$ 107c, respectively, as a polynomial for each term of a memory tap $l_s$=0, 1, or 2

$$d\left(n-\frac{i}{2}+\frac{1}{2}-\frac{l_s}{2}\right)$$

in sampling after twofold interpolation. The FIR filter$_0$ 107a is related to the memory tap $l_s$=0 in sampling after twofold interpolation. The FIR filter$_1$ 107b is related to the memory tap $l_s$=1 in sampling after twofold interpolation. The FIR filter$_2$ 107c is related to the memory tap $l_s$=2 in sampling after twofold interpolation.

For an input $$d\left(n-\frac{i}{2}+\frac{1}{2}-\frac{l_s}{2}\right),$$

each of the FIR filter$_0$ 107*a*, the FIR filter$_1$ 107*b*, and the FIR filter$_2$ 107*c* outputs each signal described below related to each of FIR taps r$_s$=0, 1, 2, 3, and 4 in sampling after twofold interpolation.

At the FIR tap r$_s$=0, the (j/2−1)-sample delay device 112 outputs $$d\left(n - \frac{i}{2} + \frac{1}{2} - \frac{l_s}{2} - \frac{j}{2} + 1\right)$$

corresponding to a signal delayed by (j−2) samples in sampling after twofold interpolation.

At the FIR tap r$_s$=1, the sub-sample delay filter 111 configured with a j-tap FIR filter outputs $$d\left(n - \frac{i}{2} + \frac{1}{2} - \frac{l_s}{2} - \frac{j}{2} + \frac{1}{2}\right)$$

corresponding to a signal delayed by (j−1) samples in sampling after twofold interpolation.

At the FIR tap r$_s$=2, the 1-sample delay device 113*a* in the subsequent stage of the (j/2−1)-sample delay device 112 outputs $$d\left(n - \frac{i}{2} + \frac{1}{2} - \frac{l_s}{2} - \frac{j}{2}\right)$$

corresponding to a signal delayed by j samples in sampling after twofold interpolation.

At the FIR tap r$_s$=3, the 1-sample delay device 113*c* in the subsequent stage of the sub-sample delay filter 111 outputs $$d\left(n - \frac{i}{2} + \frac{1}{2} - \frac{l_s}{2} - \frac{j}{2} - \frac{1}{2}\right)$$

corresponding to a signal delayed by (j+1) samples in sampling after twofold interpolation.

At the FIR tap r$_s$=4, the 1-sample delay device 113*b* in the subsequent stage of the 1-sample delay device 113*a* outputs $$d\left(n - \frac{i}{2} + \frac{1}{2} - \frac{l_s}{2} - \frac{j}{2} - 1\right)$$

corresponding to a signal delayed by (j+2) samples in sampling after twofold interpolation.

A generalized expression of the output from each of the aforementioned five taps in the FIR$_{l_s}$ related to each memory tap $l_s$ with the memory tap $l_s$ (=0, 1, or 2) and the FIR tap r$_s$(=0, 1, 2, 3, or 4) as variables is as follows.

$$d\left(n + \frac{3 - i - j - l_s - r_s}{2}\right)$$

In other words, the output signal of each FIR tap r$_s$ corresponding to delaying in steps of one sample in sampling after the aforementioned twofold interpolation is expressed as follows.

$$d\left(n + \frac{3 - i - j - l_s - r_s}{2}\right)$$

Each of the complex multipliers 114*a*, 114*d*, 114*b*, 114*e*, and 114*c* complex-multiplies the output signal of the related FIR tap r$_s$ by a filter (complex) coefficient $W_{l_s,0}$, $W_{l_s,1}$, $W_{l_s,2}$, $W_{l_s,3}$, or $W_{l_s,4}$ related to the FIR tap r$_s$=0, 1, 2, 3, or 4, respectively. Subsequently, the signals complex-multiplied by the complex multipliers 114*a*, 114*d*, 114*b*, 114*e*, and 114*c*, respectively, are added by the adder 115. The signal added by the adder 115 is output from each of the FIR filter$_0$ 107*a*, the FIR filter$_1$ 107*b*, and the FIR filter$_2$ 107*c* as $$\sum_{r_s=0}^{4} W_{l_s,r_s} \cdot d\left(n + \frac{3 - i - j - l_s - r_s}{2}\right)$$

for each memory tap $l_s$.

At this time, the output signal of the FIR filter$_0$ 107*a* related to the memory tap $l_s$=0 is as follows.

$$\sum_{r_s=0}^{4} W_{0,r_s} \cdot d\left(n + \frac{3 - i - j - r_s}{2}\right)$$

The output signal of the FIR filter$_1$ 107*b* related to the memory tap $l_s$=1 is as follows.

$$\sum_{r_s=0}^{4} W_{1,r_s} \cdot d\left(n + \frac{2 - i - j - r_s}{2}\right)$$

The output signal of the FIR filter$_2$ 107*c* related to the memory tap $l_s$=2 is as follows.

$$\sum_{r_s=0}^{4} W_{2,r_s} \cdot d\left(n + \frac{1 - i - j - r_s}{2}\right)$$

The output signals of the FIR filter$_0$ 107*a*, the FIR filter$_1$ 107*b*, and the FIR filter$_2$ 107*c* are eventually added by the adder 108, and the added signal is output from the DPD 1 as a polynomial expressed by the aforementioned equation (20) with a reduced number of coefficients.

As described above, the tap coefficients of the pseudo-interpolation/sub-sample-shift filters 101*a* and 101*b* and the tap coefficients of the sub-sample delay filter 111 are known fixed coefficients and do not need to be changed.

Further, the i/2-sample delay device 102 is a fixed delay device determined by the number of taps i of the pseudo-interpolation/sub-sample-shift filters 101*a* and 101*b*. Similarly, the (j/2−1)-sample delay device 112 is a fixed delay device determined by the number of taps j of the sub-sample delay filter 111.

Accordingly, in the DPD 1 according to Patent Literature 3 illustrated in FIG. 9, the number of power series coefficients in the LUTs 105*a*, 105*b*, and 105*c* and the number of tap coefficients of the FIR filter$_0$ 107*a*, the FIR filter$_1$ 107*b*, and the FIR filter$_2$ 107*c* that need to be derived and updated by adaptive control are identical to the number of coefficients in the aforementioned equation (8) in which the number of coefficients is reduced by 30% and the configuration illustrated in FIG. 5, in comparison with the related art.

First, for the purpose of comparison, an example of, in a distortion compensation apparatus not performing DPD upsampling, using a signal with a system bandwidth of 800 MHz at a sampling frequency of 983.04 MHz as an input signal of the DPD 1 without upsampling and operating the DPD 1 by adaptive control with the following equation (22) as an error evaluation function by applying the aforementioned equation (8) and the configuration in FIG. 5 is described.

$$NRMSE = 10 \cdot \log_{10}\left(\frac{\sum_{n=1}^{N}|z(n) - x(n)|^2}{\sum_{n=1}^{N}|x(n)|^2}\right) \quad (22)$$

Note that, in the equation (22), $x_u(n)$ and $z_u(n)$ in the aforementioned equation (10) are substituted by $x(n)$ and $z(n)$, respectively, based on FIG. 6, in order to adapt to the configuration in which DPD upsampling is not performed.

With the aforementioned equation (8) and the configuration in FIG. 5, the DPD 1 operating at a sampling rate before interpolation by the interpolation DA converter 2 in the subsequent stage of the DPD 1 cannot generate a distortion compensation signal compensating for a memory effect within a carrier band for a sub-sample.

On the other hand, a case of using a signal with a system bandwidth of 800 MHz at a sampling frequency of 983.04 MHz as an input signal of the DPD 1 without upsampling, similarly to the above but operating the DPD 1 by adaptive control with the aforementioned equation (22) as an error evaluation function by applying the aforementioned equation (20) and the configuration in FIG. 9 is considered. In this case, as indicated in the description of the aforementioned equation (20) and the configuration in FIG. 9, a distortion compensation signal compensating for a memory effect within the carrier band for a sub-sample for the DPD 1 can be generated by the sub-sample memory taps provided by the pseudo-interpolation/sub-sample-shift filters 101a and 101b and the sub-sample FIR taps provided by the sub-sample delay filter 111.

As described above, the DPD 1 according to Patent Literature 3 illustrated in FIG. 9 is premised on operation at a low sampling rate for sampling an input signal not DPD upsampled in a previous stage of the DPD 1.

By using a polynomial structure including the pseudo-interpolation/sub-sample-shift filters 101a and 101b, the DPD 1 according to Patent Literature 3 illustrated in FIG. 9 can generate, for example, a signal corresponding to the twofold-upsampled signal $x_u(n-l_s)$ in the aforementioned equation (8) with a reduced number of coefficients and FIG. 5 from a sample signal sequence of non-upsampled input signals of the DPD 1.

Further, by using the FIR filter$_0$ 107a, the FIR filter$_1$ 107b, and the FIR filter$_2$ 107c each including the sub-sample delay filter 111, the FIR filters being placed in a subsequent stage of the polynomial structure, the DPD 1 according to Patent Literature 3 illustrated in FIG. 9 can provide, for example, an FIR filter equivalent to the FIR filter$_0$ 405a, the FIR filter$_1$ 405b, and the FIR filter$_2$ 405c in FIG. 5 operating at a twofold sampling frequency.

Therefore, by using the aforementioned polynomial structure, and the FIR filter$_0$ 107a, the FIR filter$_1$ 107b, and the FIR filter$_2$ 107c, the DPD 1 according to Patent Literature 3 illustrated in FIG. 9 not only compensates for distortion due to a sample point but also compensates for distortion due to a sub-sample point between sample points for the DPD 1.

Accordingly, while the distortion compensation apparatus according to Patent Literature 3 illustrated in FIG. 9 is a distortion compensation apparatus operating at a low sampling rate without performing DPD upsampling processing in a previous stage of the DPD 1, the apparatus can reduce an amount of coefficient calculation and can also reduce the operating frequency of the DPD 1 and sampling rates of the DA converter 2 and the AD converter 7, compared with the upsampling distortion compensation apparatus according to the related art. Furthermore, the distortion compensation apparatus can compensate for a memory effect within a carrier band due to a sub-sample memory tap between sample points in the DPD 1 and therefore can achieve target compensation performance.

While the DPD 1 according to Patent Literature 3 illustrated in FIG. 9 has been described above, the technology according to Patent Literature 3 has another problem.

With regard to the polynomial structure according to Patent Literature 3, Patent Literature 3 mentions an application example of a cross-term configuration in which combinations of complex multiplication of a signal $$x\left(n - \frac{i}{2} + \frac{1}{2} - \frac{l_s}{2}\right)$$

corresponding to delaying in steps of one sample in sampling after twofold interpolation by each LUT output $$K_{l_s}\left(\left|x\left(n - \frac{i}{2} + \frac{1}{2} - \frac{l_s}{2}\right)\right|\right)$$

by the complex multipliers 106a, 106b, and 106c are fixed to multiplications of terms with different memory tap $l_s$ values.

However, in construction of a power amplifier model optimum for distortion compensation, a complex multiplication configuration based on fixed cross terms has a problem that a degree of freedom does not exist in the configuration, and hardware in which memory taps for each combination of cross terms to be complex-multiplied are changed for each amplifier to be compensated is required.

On the other hand, when a circuit configuration is generalized in such a way as to support any cross-term combination, there remains another problem that the circuit becomes complex, and the primary purpose of achieving target compensation performance while reducing the number of coefficients cannot be achieved.

In view of the problems described above, an object of the present disclosure is to provide a distortion compensation apparatus and a distortion compensation method that can give a degree of freedom to a combination in a cross-term-based complex multiplication configuration with a small amount of circuit addition without increasing the number of coefficients.

Solution to Problem

In order to solve the aforementioned problems, a distortion compensation apparatus according to the present disclosure is a distortion compensation apparatus configured to compensate for non-linear distortion of a power amplifier and includes:

an AD converter configured to feed back and analog/digital (AD) convert an output signal of the power amplifier and output the AD converted signal as a feedback signal;

a digital predistorter configured to perform distortion compensation processing on an input signal by using the feedback signal and output the signal undergoing distortion compensation processing; and a DA converter configured to be provided between the digital predistorter and the power amplifier, digital/analog (DA) convert an output signal of the digital predistorter, and output the DA converted signal to the power amplifier, wherein the digital predistorter
operates at a sampling rate for sampling the input signal not upsampled in a previous stage of the digital predistorter,
includes:
a polynomial structure configured to include a pseudo-interpolation/sub-sample-shift processing unit configured to pseudo-interpolate a sample point between sample points of the input signal and shift the pseudo-interpolated sample point by a sub-sample and include a multiplexer configured to select a combination of a sub-sample shift amount in complex-multiplication of a signal itself acquired by processing the input signal by the pseudo-interpolation/sub-sample-shift processing unit by an output of a look up table related to an amplitude address corresponding to an amplitude of a signal acquired by processing the input signal by the pseudo-interpolation/sub-sample-shift processing unit; and a finite impulse response (FIR) filter configured to be provided in a subsequent stage of the polynomial structure and include a sub-sample delay filter delaying a sample point of the input signal by a sub-sample, and compensates for distortion due to a sample point of the input signal and compensates for distortion due to a sub-sample point between sample points of the input signal for the digital predistorter, by using the polynomial structure and the FIR filter.

In order to solve the aforementioned problems, a distortion compensation method according to the present disclosure is a distortion compensation method by a distortion compensation apparatus configured to compensate for non-linear distortion of a power amplifier and includes:

in a digital predistorter, performing distortion compensation processing on an input signal by using a feedback signal acquired by feeding back and analog/digital (AD) converting an output signal of the power amplifier, and outputting the signal undergoing distortion compensation processing; and digital/analog (DA) converting an output signal of the digital predistorter and outputting the DA converted signal to the power amplifier, wherein the digital predistorter
operates at a sampling rate for sampling the input signal not upsampled in a previous stage of the digital predistorter,
includes:
a polynomial structure configured to include a pseudo-interpolation/sub-sample-shift processing unit configured to pseudo-interpolate a sample point between sample points of the input signal and shift the pseudo-interpolated sample point by a sub-sample and include a multiplexer configured to select a combination of a sub-sample shift amount in complex-multiplication of a signal itself acquired by processing the input signal by the pseudo-interpolation/sub-sample-shift processing unit by an output of a look up table related to an amplitude address corresponding to an amplitude of a signal acquired by processing the input signal by the pseudo-interpolation/sub-sample-shift processing unit; and a finite impulse response (FIR) filter configured to be provided in a subsequent stage of the polynomial structure and include a sub-sample delay filter delaying a sample point of the input signal by a sub-sample, and compensates for distortion due to a sample point of the input signal and compensates for distortion due to a sub-sample point between sample points of the input signal for the digital predistorter, by using the polynomial structure and the FIR filter.

Advantageous Effects of Invention

The present disclosure produces an effect of providing a distortion compensation apparatus and a distortion compensation method that can give a degree of freedom to a combination in a cross-term-based complex-multiplication configuration with a small amount of circuit addition without increasing the number of coefficients.

DESCRIPTION OF EMBODIMENTS

An example embodiment of the present disclosure is described below with reference to drawings.

Configuration of Example Embodiment

Figure 1A:
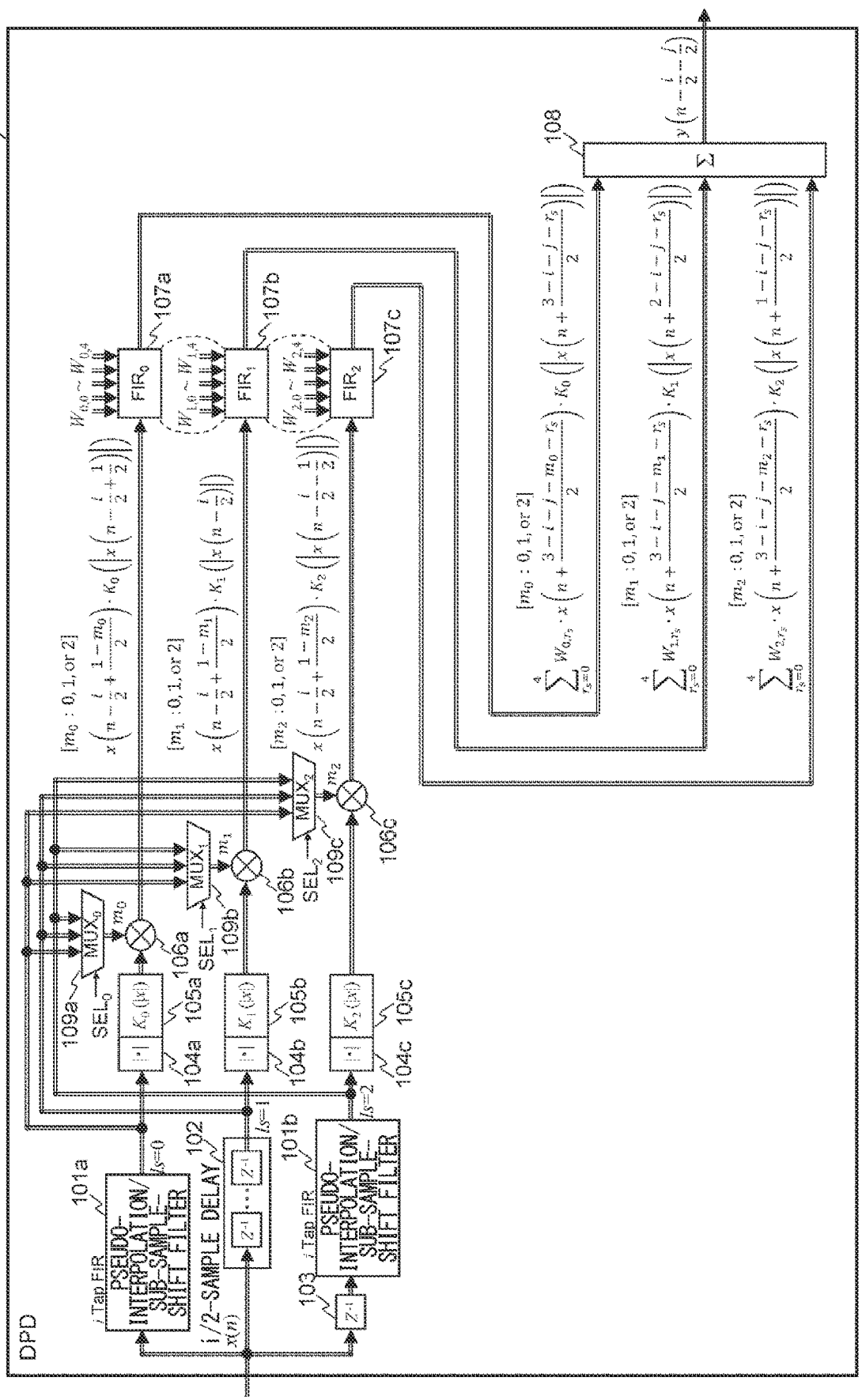
FIG. 1A is a block diagram illustrating a configuration example of a DPD according to an example embodiment of the present disclosure.
Figure 1B:
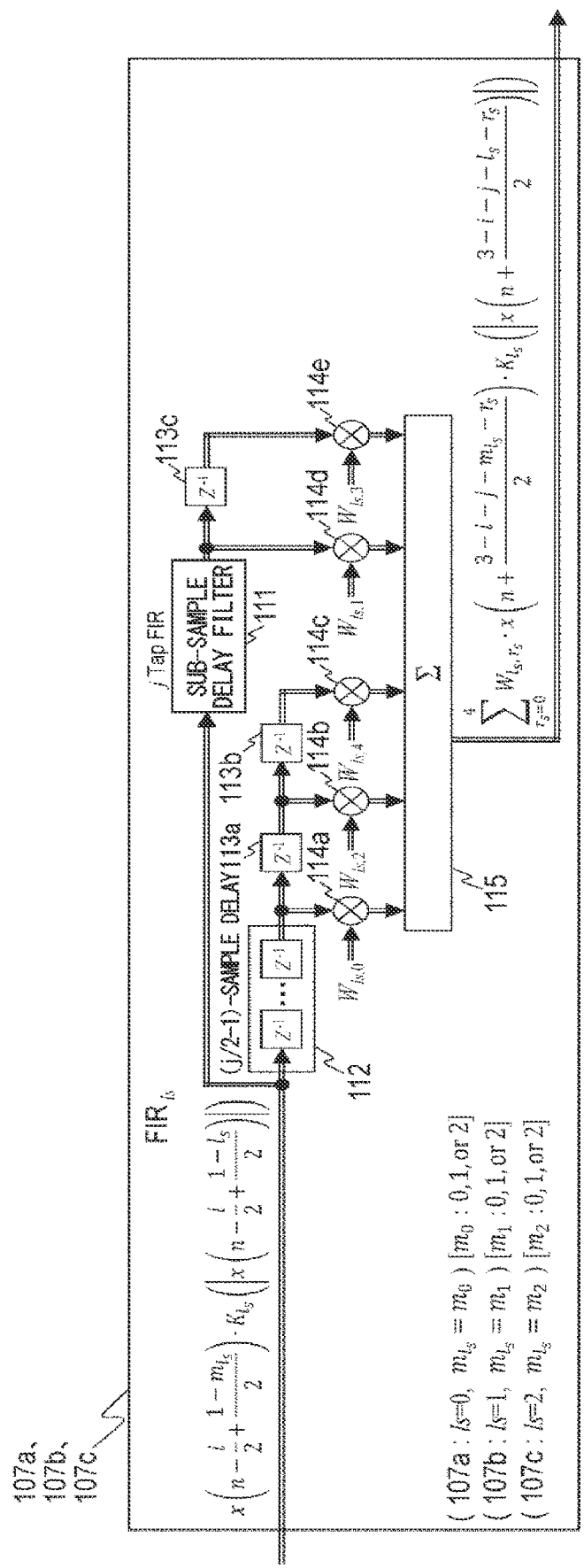
FIG. 1B is a block diagram illustrating a configuration example of an FIR filter in the DPD according to the example embodiment of the present disclosure.
Figure 2:
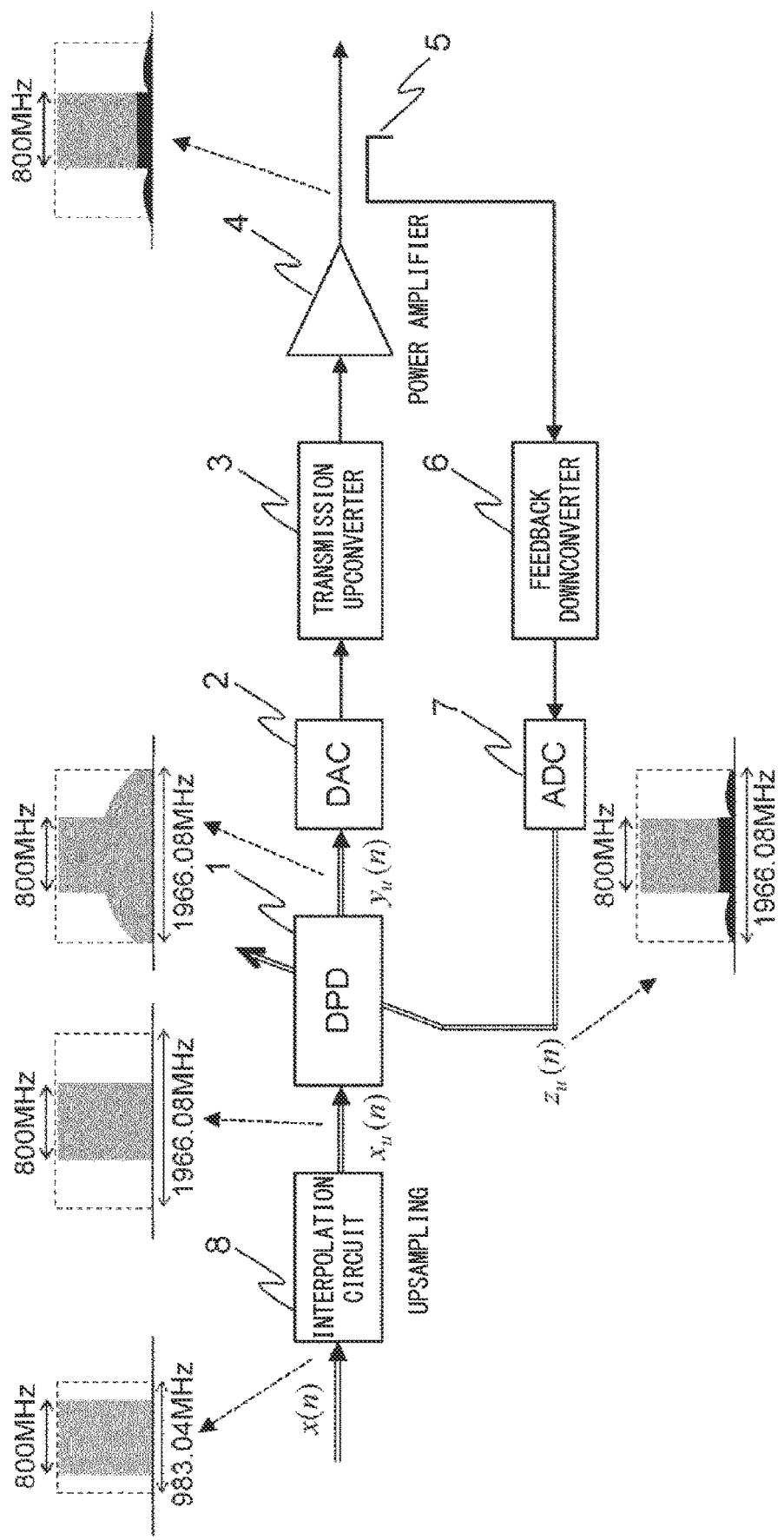
FIG. 2 is a block diagram illustrating a configuration example of a distortion compensation apparatus according to a related art.
Figure 3:
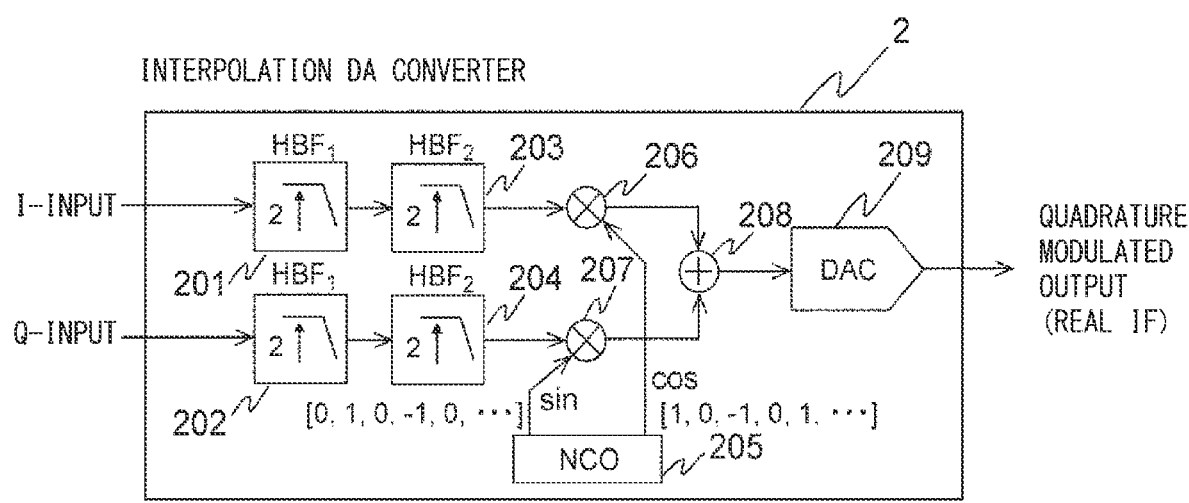
FIG. 3 is a block diagram illustrating a functional example of an interpolation DA converter.
Figure 4:
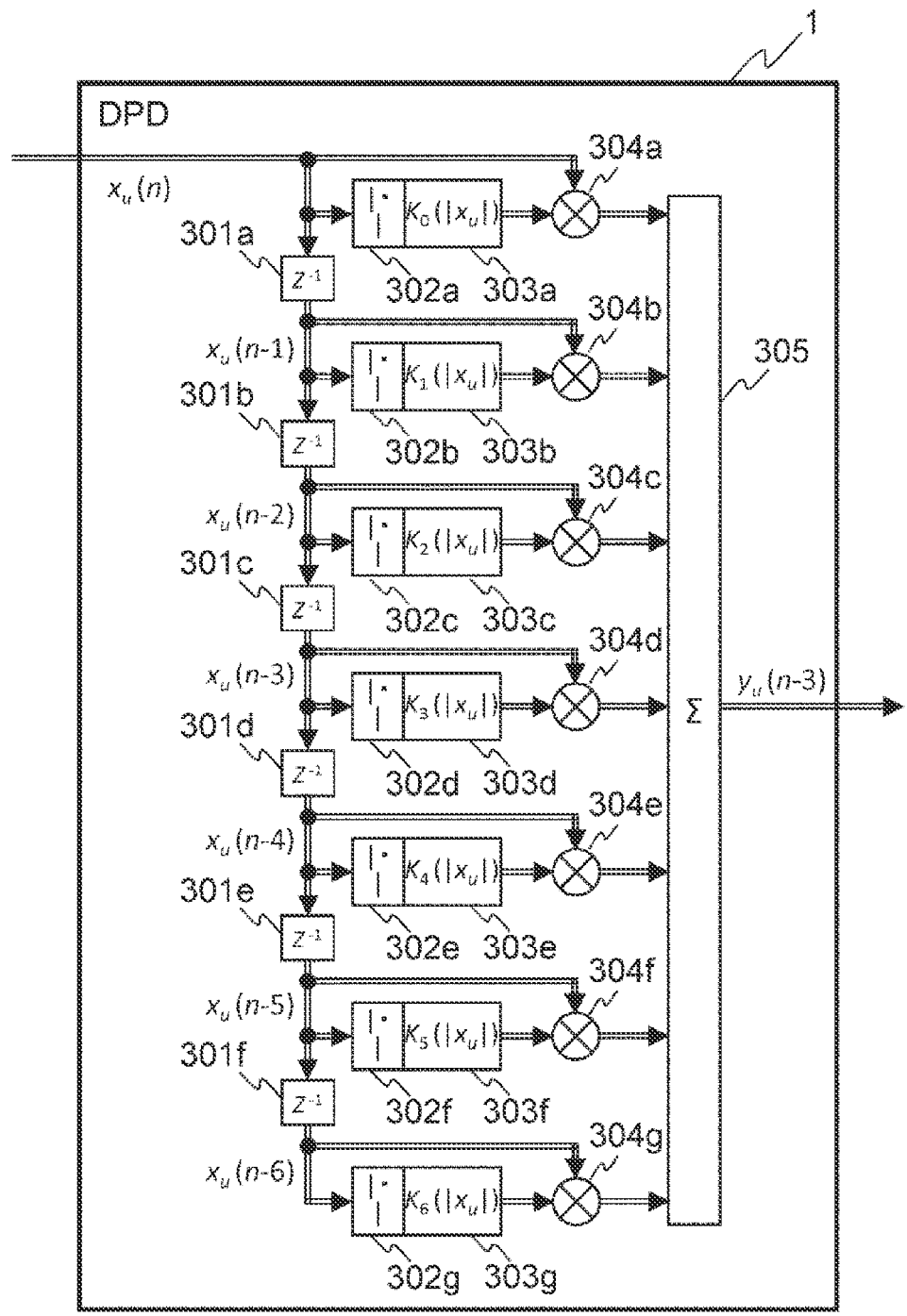
FIG. 4 is a block diagram illustrating a configuration example of a DPD in the distortion compensation apparatus according to the related art illustrated in FIG. 2.
Figure 5:
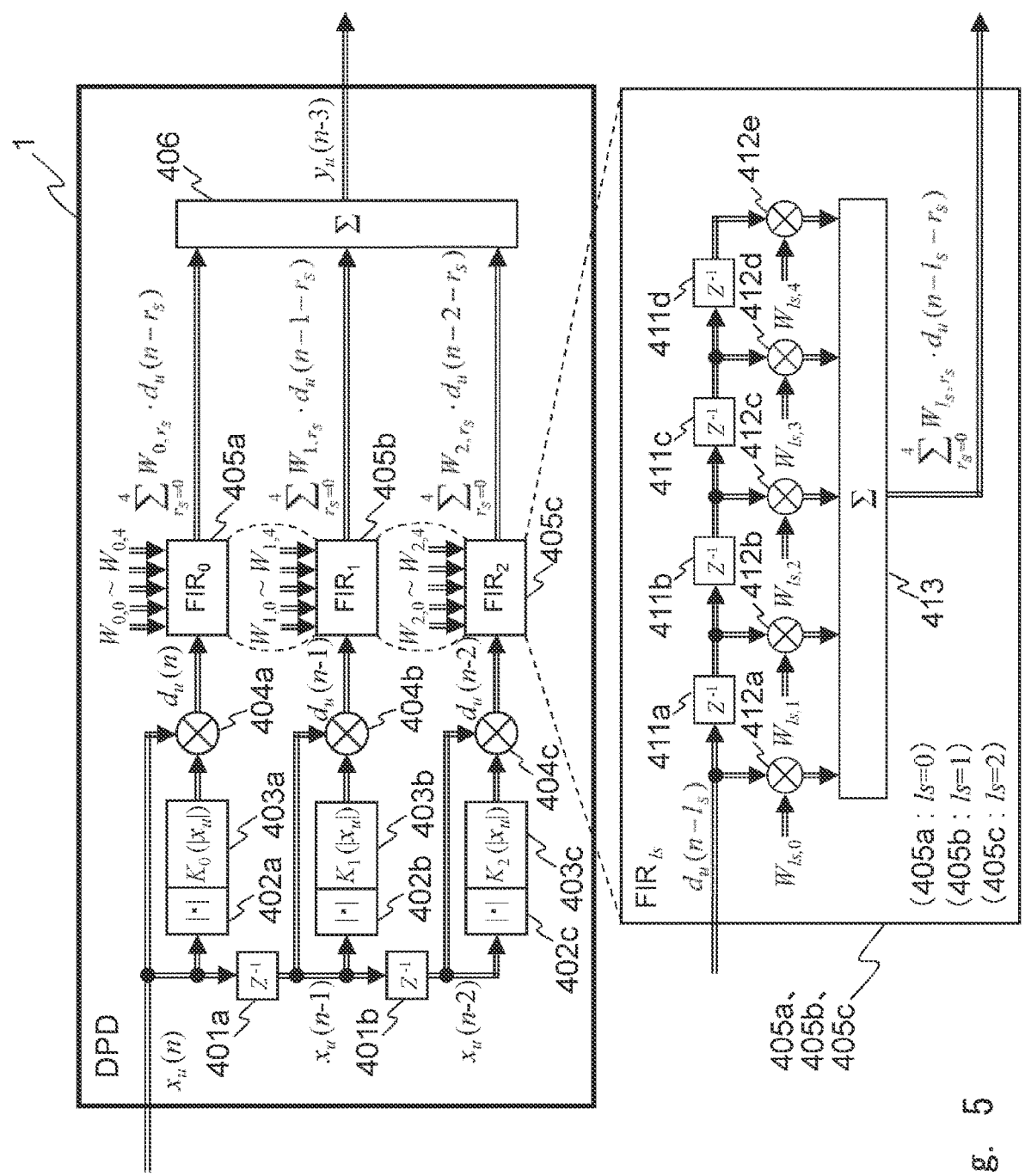
FIG. 5 is a block diagram illustrating a configuration example of a DPD acquired by applying a measure for reducing the number of coefficients to the DPD according to the related art illustrated in FIG. 4.
Figure 6:
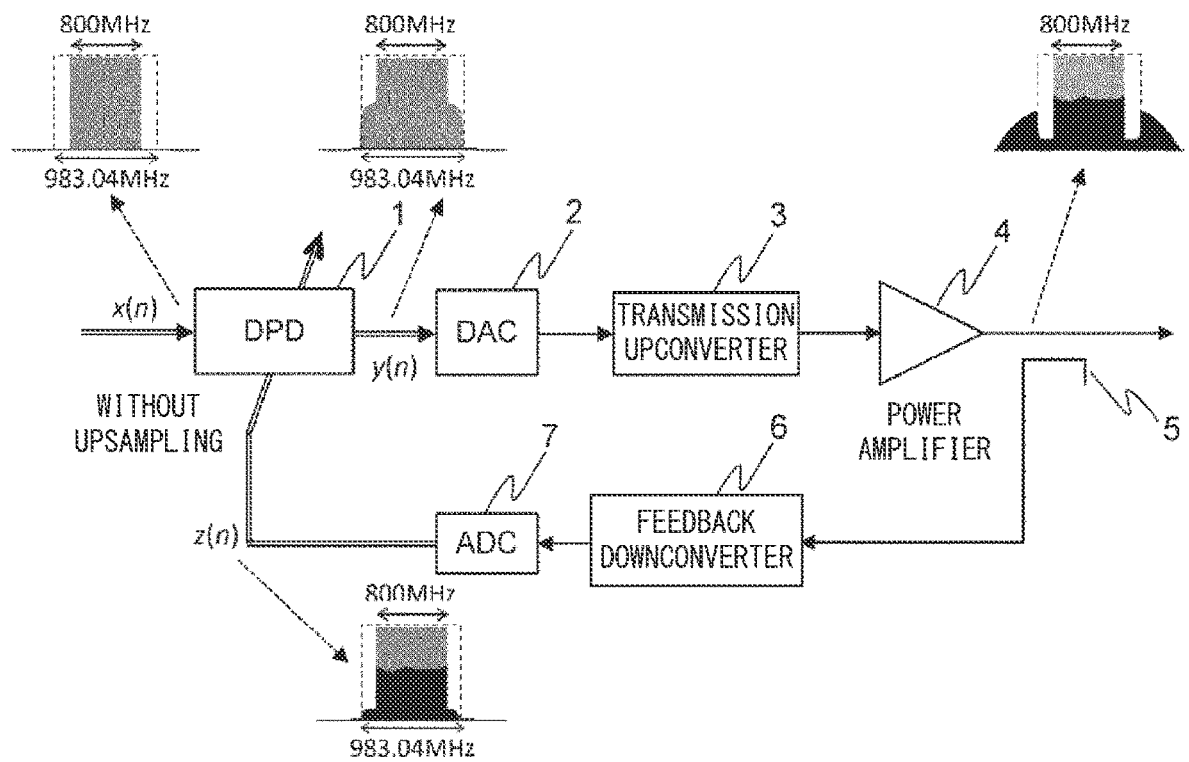
FIG. 6 is a block diagram illustrating a configuration example of a distortion compensation apparatus in which an interpolation circuit is deleted and DPD upsampling is not performed.
Figure 7:
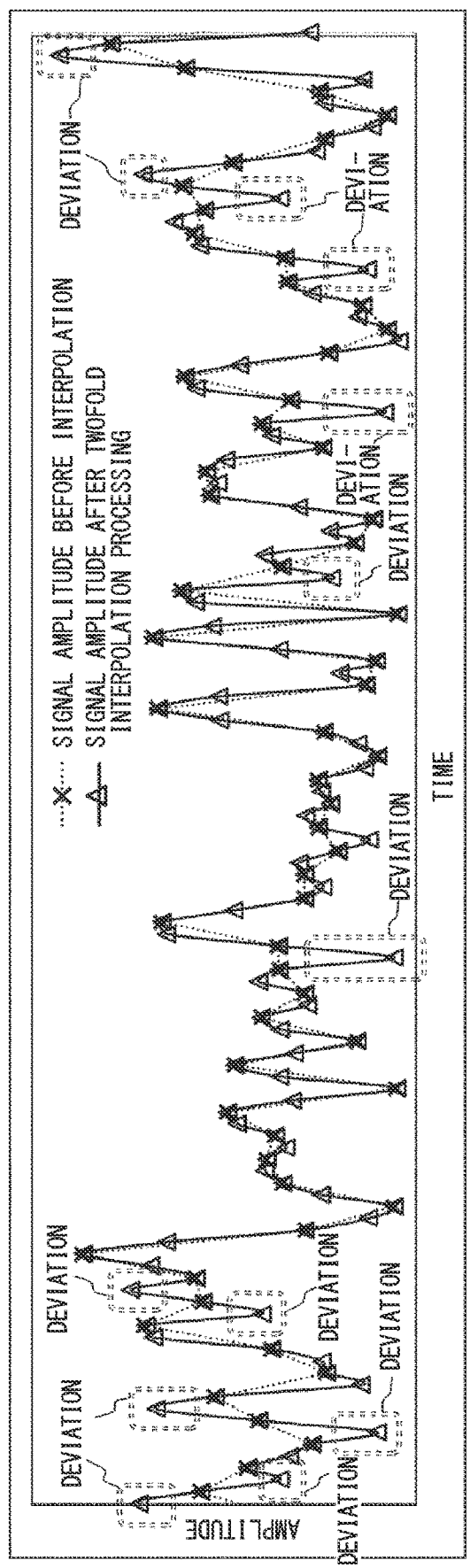
FIG. 7 is a diagram illustrating a comparison example between amplitude changes of a signal in an 800 MHz bandwidth at a sampling frequency of 983.04 MHz before interpolation and amplitude changes of a signal acquired by twofold-upsampling the signal at a sampling frequency of 1.96608 GHz by twofold interpolation processing.
Figure 8:
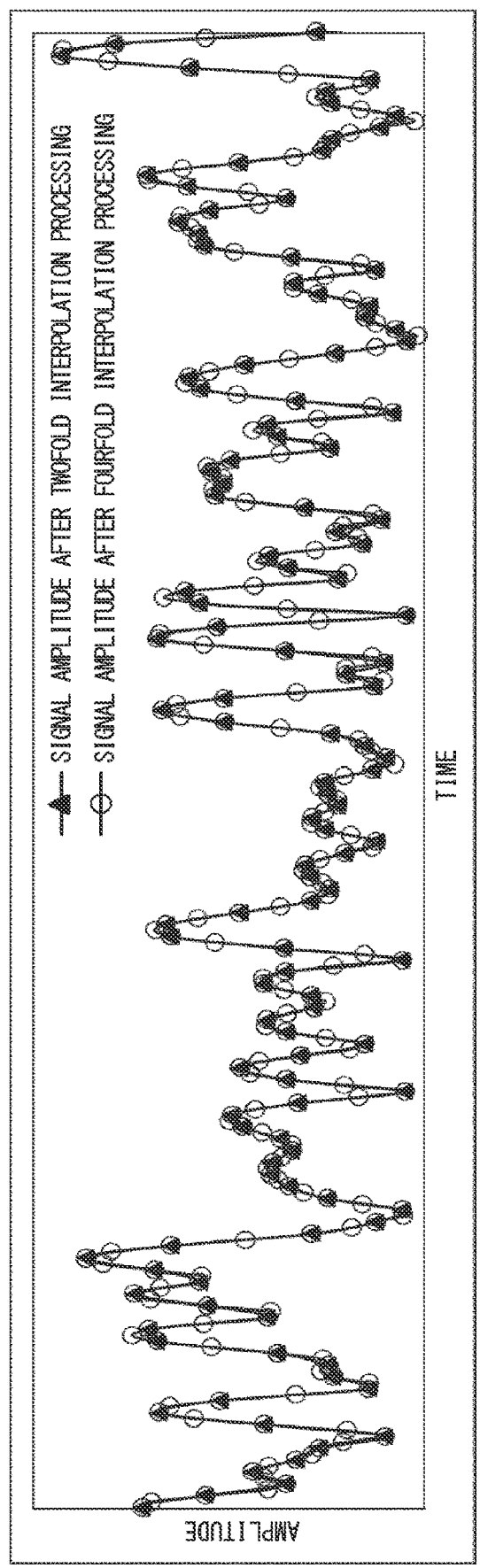
FIG. 8 is a diagram illustrating a comparison example between amplitude changes of a signal twofold-upsampled at a sampling frequency of 1.96608 GHz by twofold interpolation processing and amplitude changes of a signal acquired by further fourfold-upsampling the signal at a sampling frequency of 3.93216 GHz by twofold interpolation processing.

FIG. 1A and FIG. 1B illustrate block diagrams of a configuration example of a DPD 1 according to the present example embodiment. FIG. 1A illustrates a configuration example of the DPD 1 according to the present example embodiment, and FIG. 1B illustrates a configuration example of an FIR filter$_0$ 107a, an FIR filter$_1$ 107b, and an FIR filter$_2$ 107c in the DPD 1 according to the present example embodiment.

Figure 9:
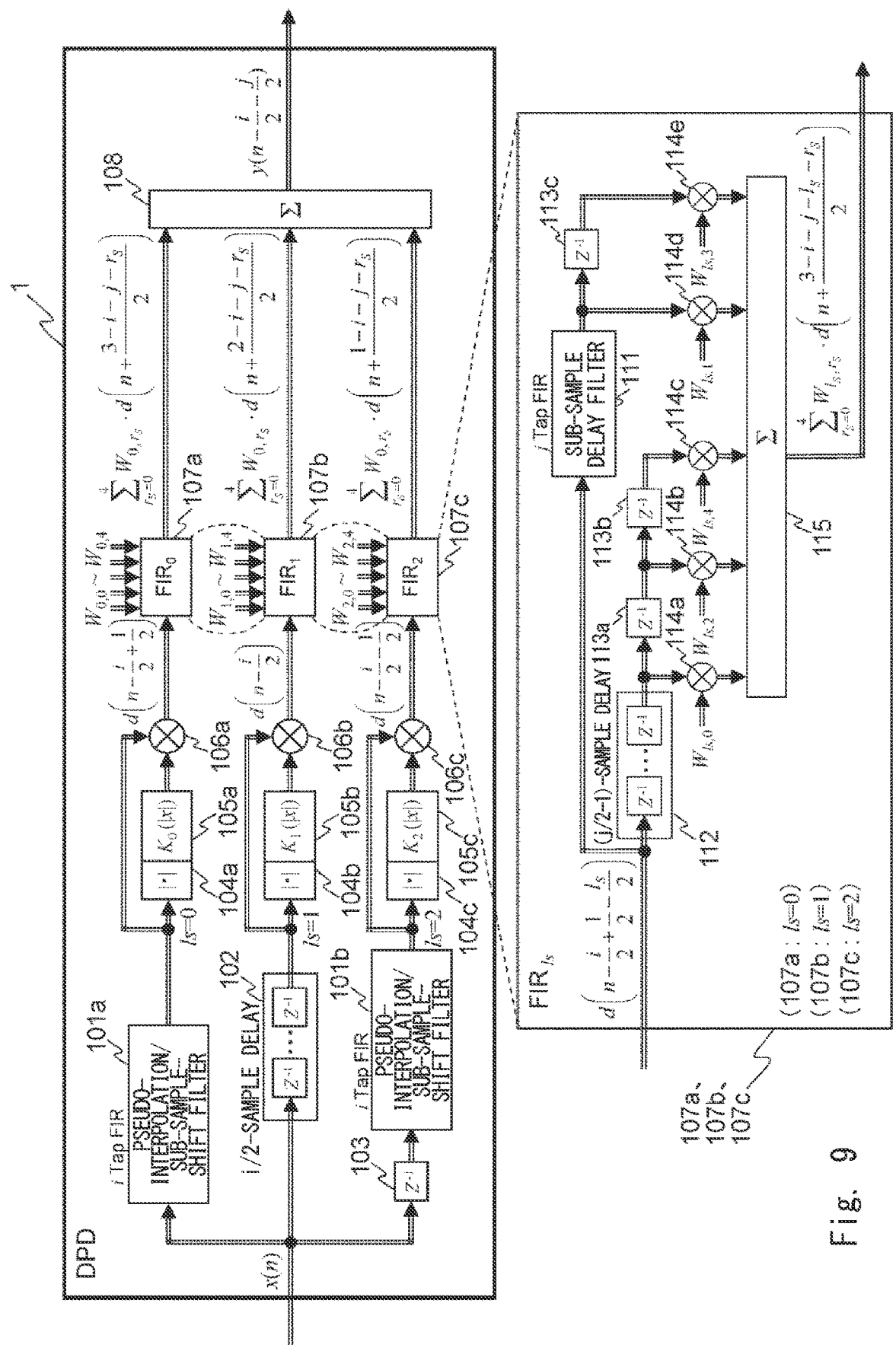
FIG. 9 is a block diagram illustrating a configuration example of a DPD disclosed in Patent Literature 3.
Figure 10:
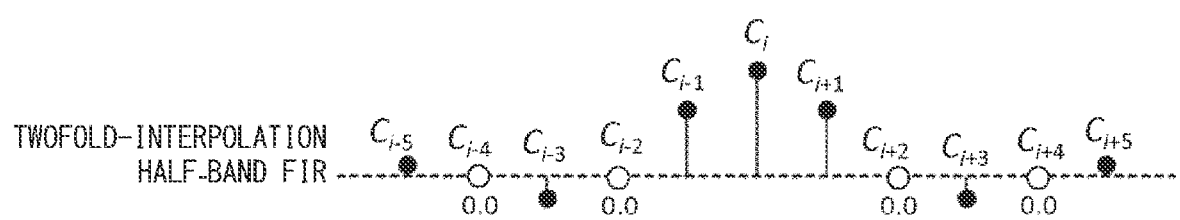
FIG. 10 is a diagram illustrating an example of tap coefficients of a twofold-interpolation half-band FIR filter incorporated in an interpolation DA converter.
Figure 11:
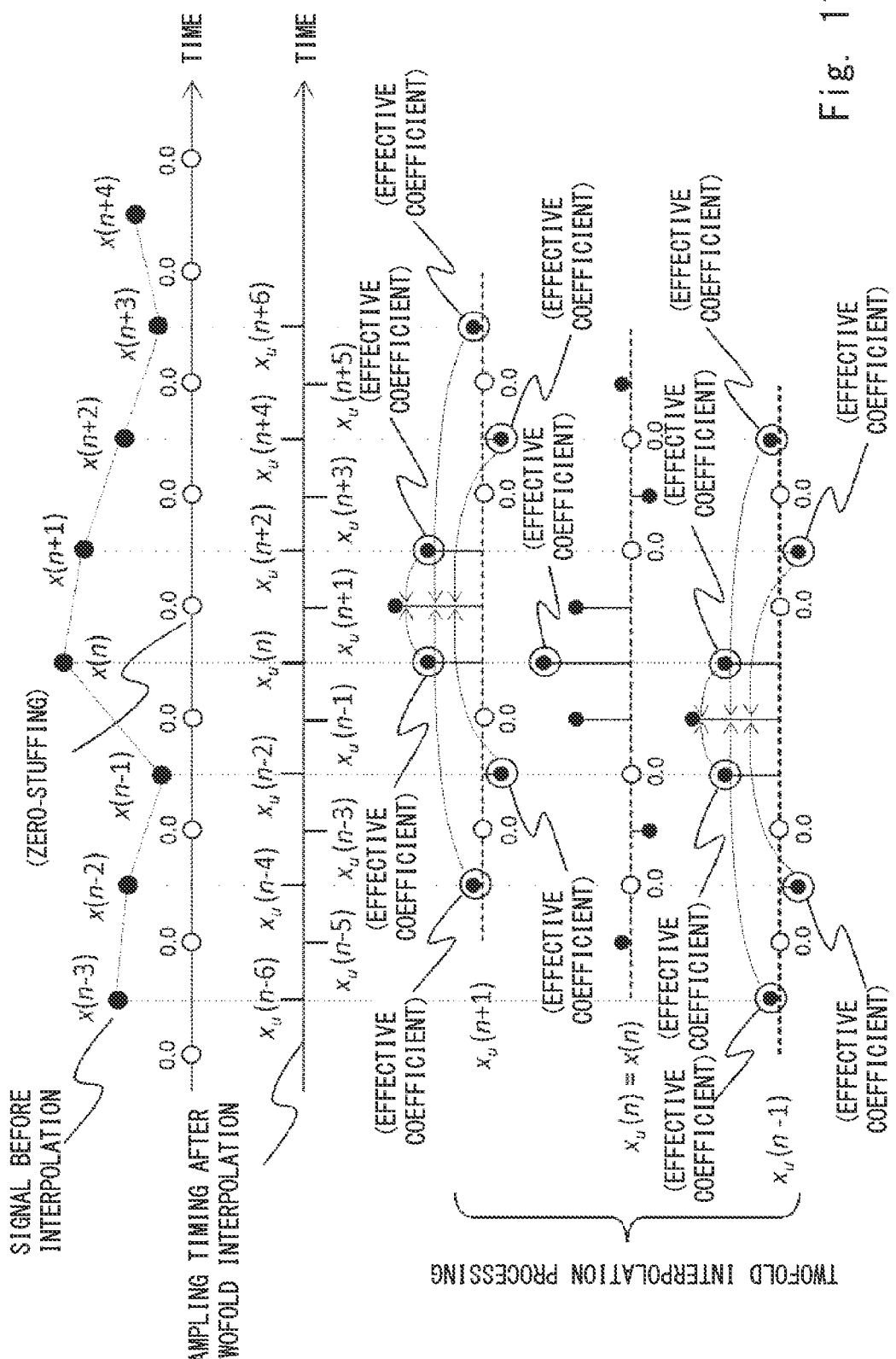
FIG. 11 is a timing chart illustrating an example of twofold interpolation processing in the interpolation DA converter.
Figure 12:
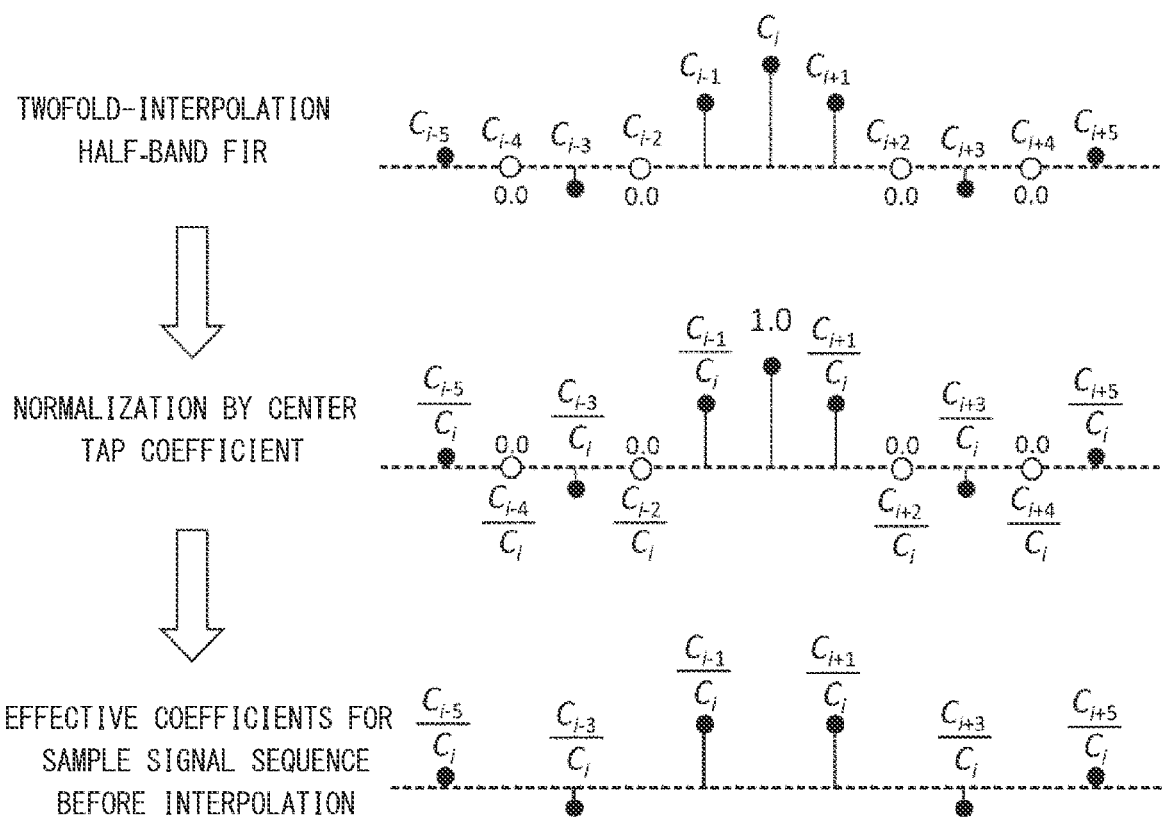
FIG. 12 is a diagram illustrating an example of a procedure for acquiring tap coefficients of a pseudo-interpolation filter for acquiring sub-sample memory taps=±0.5 for a DPD operating at a non-upsampled sampling rate.
Figure 13A:
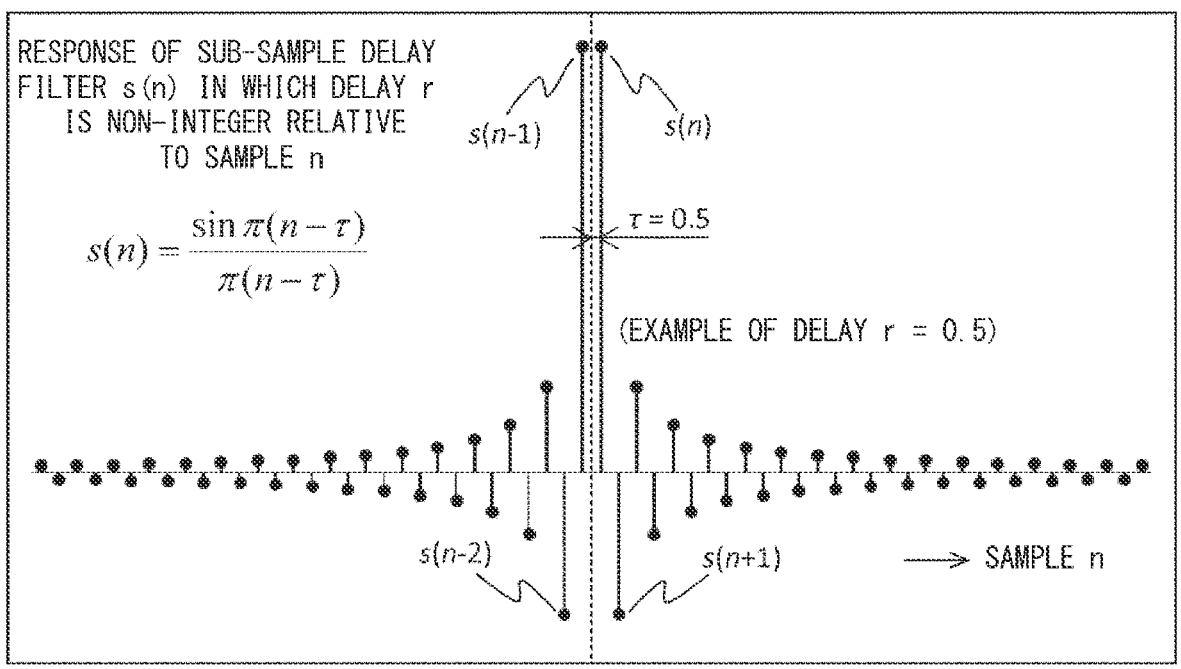
FIG. 13A is a diagram illustrating an example of an impulse response of a 0.5-sample delay filter in a case of a delay being a non-integer relative to a sample.
Figure 13B:
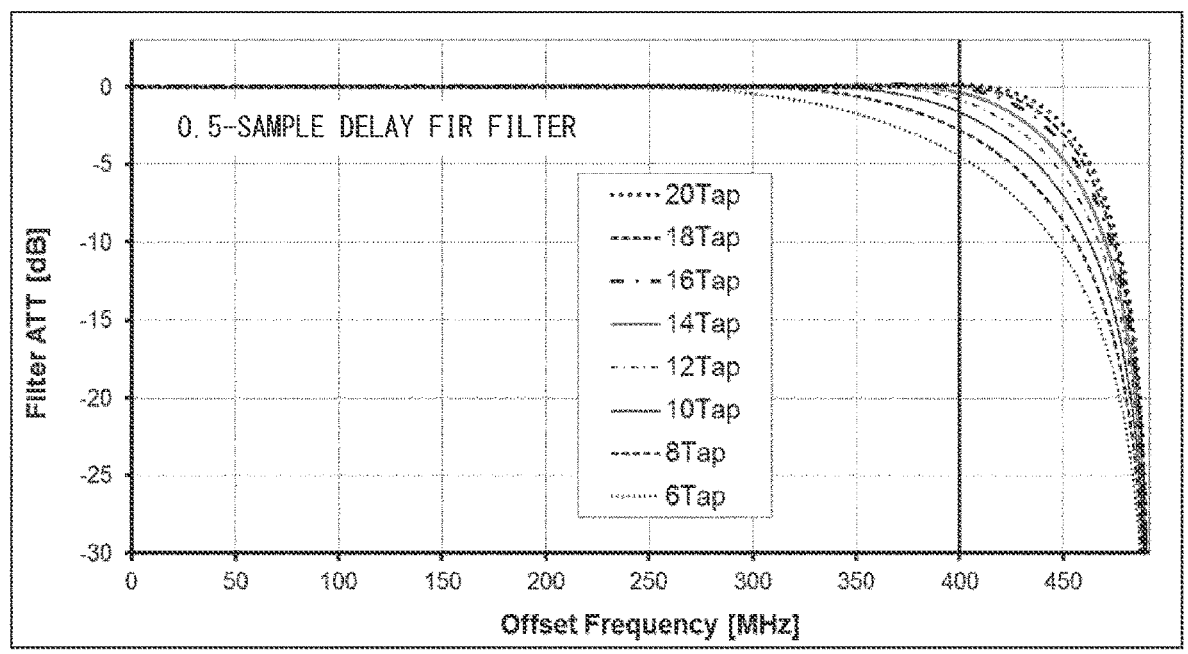
FIG. 13B is a diagram illustrating an example of a frequency characteristic of an amount of filter attenuation for the number of taps when a 0.5-sample delay filter is configured with an FIR filter.

The DPD 1 according to the present example embodiment illustrated in FIG. 1A and FIG. 1B includes a multiplexer$_0$ 109a, a multiplexer$_1$ 109b, and a multiplexer$_2$ 109c in addition to the DPD 1 according to Patent Literature 3 illustrated in FIG. 9.

The multiplexer$_0$ 109a is a multiplexer that can select a signal to be complex-multiplied by an output of a LUT 105a by a complex multiplier 106a in a path related to a memory tap $l_s$=0, that is, a path in which the pseudo-interpolation/sub-sample-shift filter 101a, an amplitude address calculation circuit 104a, and the LUT 105a are placed from among an output of a pseudo-interpolation/sub-sample-shift filter 101a, an output of an i/2-sample delay device 102, and an output of a pseudo-interpolation/sub-sample-shift filter 101b.

The multiplexer$_1$ 109b is a multiplexer that can select a signal to be complex-multiplied by an output of a LUT 105b by a complex multiplier 106b in a path related to a memory tap $l_s$=1, that is, a path in which the i/2-sample delay device 102, an amplitude address calculation circuit 104b, and the LUT 105b are placed from among the output of the pseudo-interpolation/sub-sample-shift filter 101a, the output of the i/2-sample delay device 102, and the output of the pseudo-interpolation/sub-sample-shift filter 101b.

The multiplexer$_2$ 109c is a multiplexer that can select a signal to be complex-multiplied by an output of a LUT 105c by a complex multiplier 106c in a path related to a memory tap $l_s$=2, that is, a path in which the pseudo-interpolation/sub-sample-shift filter 101b, an amplitude address calculation circuit 104c, and the LUT 105c are placed from among the output of the pseudo-interpolation/sub-sample-shift filter 101a, the output of the i/2-sample delay device 102, and the output of the pseudo-interpolation/sub-sample-shift filter 101b.

A multiplexer is generally a circuit mechanism selecting or aggregating two or more inputs and outputting one resulting signal. Each of the multiplexer$_0$ 109a, the multiplexer$_1$ 109b, and the multiplexer$_2$ 109c according to the present disclosure is a multiplexer as a data selector and, for example, includes three lines of data inputs and one line of a data output. Each of the multiplexer$_0$ 109a, the multiplexer$_1$ 109b, and the multiplexer$_2$ 109c selects one line from among the three lines of input signals and set the selected one line as an output signal in accordance with each of selection control signals $SEL_0$, $SEL_1$, and $SEL_2$.

In a path related to a memory tap $l_s$($l_s$=0, 1, or 2), a memory tap of, in sampling after twofold interpolation, a signal selected by a multiplexer for each path from among the output of the pseudo-interpolation/sub-sample-shift filter 101a, the output of the i/2-sample delay device 102, and the output of the pseudo-interpolation/sub-sample-shift filter 101b, is expressed as $m_{l_s}$.

Specifically, the memory tap of a signal output selected by the multiplexer$_0$ 109a for the path related to $l_s$=0 is $m_{l_s}$=$m_0$. The memory tap of a signal output selected by the multiplexer$_1$ 109b for the path related to $l_s$=1 is $m_{l_s}$=$m_1$. The memory tap of a signal output selected by the multiplexer$_2$ 109c for the path related to $l_s$=2 is $m_{l_s}$=$m_2$. One of 0, 1, and 2 is selected as $m_{l_s}$ in the example in FIG. 1A and FIG. 1B.

Operation of Example Embodiment

In the configuration according to the present example embodiment, based on LUT amplitude addresses for signals corresponding to delaying in steps of one sample in sampling after twofold interpolation, the LUTs 105a, 105b, and 105c are referred to, and output signals of the LUTs 105a, 105b, and 105c related to the LUT amplitude addresses, respectively, are acquired. Then, the complex multipliers 106a, 106b, and 106c complex-multiply the output signals of the LUTs by signals corresponding to delaying in steps of one sample in sampling after twofold interpolation, respectively. The result of complex-multiplication by the complex multipliers 106a, 106b, and 106c in the DPD 1 according to the present example embodiment, that is, an output for each term of the memory tap $l_s$ in a polynomial structure is as follows.

$$x\left(n - \frac{i}{2} + \frac{1 - m_{l_s}}{2}\right) \cdot K_{l_s}\left(\left|x\left(n - \frac{i}{2} + \frac{1 - l_s}{2}\right)\right|\right)$$

The memory tap $m_{l_s}$ ($m_{l_s}$=0, 1, or 2) in the path related to the memory tap $l_s$ ($l_s$=0, 1, or 2) can be selected by the multiplexer$_0$ 109a for the path related to $l_s$=0, the multiplexer$_1$ 109b for the path related to $l_s$=1, or the multiplexer$_2$ 109c for the path related to $l_s$=2.

The results of complex-multiplication by the complex multipliers 106a, 106b, and 106c are input to the FIR filter$_0$ 107a, the FIR filter$_1$ 107b, and the FIR filter$_2$ 107c, respectively, as a polynomial $$x\left(n - \frac{i}{2} + \frac{1 - m_{l_s}}{2}\right) \cdot K_{l_s}\left(\left|x\left(n - \frac{i}{2} + \frac{1 - l_s}{2}\right)\right|\right)$$

for each term of the memory tap $l_s=0$, 1, or 2 in sampling after twofold interpolation. The FIR filter$_0$ 107a is related to the memory tap $l_s=0$ in sampling after twofold interpolation. The FIR filter$_1$ 107b is related to the memory tap $l_s=1$ in sampling after twofold interpolation. The FIR filter$_2$ 107c is related to the memory tap $l_s=2$ in sampling after twofold interpolation.

From an input signal $$x\left(n - \frac{i}{2} + \frac{1-m_{l_s}}{2}\right) \cdot K_{l_s}\left(\left|x\left(n - \frac{i}{2} + \frac{1-l_s}{2}\right)\right|\right),$$

each of the FIR filter$_0$ 107a, the FIR filter$_1$ 107b, and the FIR filter$_2$ 107c outputs signals described below related to FIR taps $r_s=0$, 1, 2, 3, and 4, respectively, in sampling after twofold interpolation.

At the FIR tap $r_s=0$, $$x\left(n - \frac{i}{2} + \frac{1-m_{l_s}}{2} - \frac{j}{2} + 1\right) \cdot K_{l_s}\left(\left|x\left(n - \frac{i}{2} + \frac{1-l_s}{2} - \frac{j}{2} + 1\right)\right|\right)$$

corresponding to a signal delayed by (j−2) samples by a (j/2−1)-sample delay device 112 in sampling after twofold interpolation is output.

At the FIR tap $r_s=1$, $$x\left(n - \frac{i}{2} + \frac{1-m_{l_s}}{2} - \frac{j}{2} + \frac{1}{2}\right) \cdot K_{l_s}\left(\left|x\left(n - \frac{i}{2} + \frac{1-l_s}{2} - \frac{j}{2} + \frac{1}{2}\right)\right|\right)$$

corresponding to a signal delayed by (j−1) samples by a sub-sample delay filter 111 configured with a j-tap FIR filter in sampling after twofold interpolation is output.

At the FIR tap $r_s=2$, $$x\left(n - \frac{i}{2} + \frac{1-m_{l_s}}{2} - \frac{j}{2}\right) \cdot K_{l_s}\left(\left|x\left(n - \frac{i}{2} + \frac{1-l_s}{2} - \frac{j}{2}\right)\right|\right)$$

corresponding to a signal delayed by j samples by a 1-sample delay device 113a in a subsequent stage of the (j/2−1)-sample delay device 112 in sampling after twofold interpolation is output.

At the FIR tap $r_s=3$, $$x\left(n - \frac{i}{2} + \frac{1-m_{l_s}}{2} - \frac{j}{2} - \frac{1}{2}\right) \cdot K_{l_s}\left(\left|x\left(n - \frac{i}{2} + \frac{1-l_s}{2} - \frac{j}{2} - \frac{1}{2}\right)\right|\right)$$

corresponding to a signal delayed by (j+1) samples by a 1-sample delay device 113c in a subsequent stage of the sub-sample delay filter 111 in sampling after twofold interpolation is output.

At the FIR tap $r_s=4$, $$x\left(n - \frac{i}{2} + \frac{1-m_{l_s}}{2} - \frac{j}{2} - 1\right) \cdot K_{l_s}\left(\left|x\left(n - \frac{i}{2} + \frac{1-l_s}{2} - \frac{j}{2} - 1\right)\right|\right)$$

corresponding to a signal delayed by (j+2) samples by a 1-sample delay device 113b in a subsequent stage of the 1-sample delay device 113a in sampling after twofold interpolation is output.

A generalized expression of the output from each of the aforementioned five taps in the FIR$_{l_s}$ related to each memory tap $l_s$ with the memory tap $l_s$(=0, 1, or 2) and the FIR tap $r_s$ (=0, 1, 2, 3, or 4) as variables is as follows.

$$x\left(n + \frac{3-i-j-m_{l_s}-r_s}{2}\right) \cdot K_{l_s}\left(\left|x\left(n + \frac{3-i-j-l_s-r_s}{2}\right)\right|\right)$$

In other words, the output signal of each FIR tap $r_s$ corresponding to delaying in steps of one sample in the aforementioned sampling after twofold interpolation is expressed as follows.

$$x\left(n + \frac{3-i-j-m_{l_s}-r_s}{2}\right) \cdot K_{l_s}\left(\left|x\left(n + \frac{3-i-j-l_s-r_s}{2}\right)\right|\right)$$

Each of the complex multipliers 114a, 114d, 114b, 114e, and 114c complex-multiplies the output signal of the related FIR tap $r^s$ by a filter (complex) coefficient $W_{l_s,0}$, $W_{l_s,1}$, $W_{l_s,2}$, $W_{l_s,3}$, or $W_{l_s,4}$ related to the FIR tap $r_s=0$, 1, 2, 3, or 4. Subsequently, the signals respectively complex-multiplied by the complex multipliers 114a, 114d, 114b, 114e, 114c are added by an adder 115. The signal added by the adder 115 is output from each of the FIR filter$_0$ 107a, the FIR filter$_1$ 107b, and the FIR filter$_2$ 107c as $$\sum_{r_s=0}^{4} W_{l_s, r_s} \cdot x\left(n + \frac{3-i-j-m_{l_s}-r_s}{2}\right) \cdot K_{l_s}\left(\left|x\left(n + \frac{3-i-j-l_s-r_s}{2}\right)\right|\right)$$

for each memory tap $l_s$.

At this time, the output signal of the FIR filter$_0$ 107a related to the memory tap $l_s=0$ is as follows.

$$\sum_{r_s=0}^{4} W_{0, r_s} \cdot x\left(n + \frac{3-i-j-m_0-r_s}{2}\right) \cdot K_0\left(\left|x\left(n + \frac{3-i-j-r_s}{2}\right)\right|\right)$$

The output signal of the FIR filter$_1$ 107b related to the memory tap $l_s=1$ is as follows.

$$\sum_{r_s=0}^{4} W_{1, r_s} \cdot x\left(n + \frac{3-i-j-m_1-r_s}{2}\right) \cdot K_1\left(\left|x\left(n + \frac{2-i-j-r_s}{2}\right)\right|\right)$$

The output signal of the FIR filter$_2$ 107c related to the memory tap $l_s=2$ is as follows.

$$\sum_{r_s=0}^{4} W_{2, r_s} \cdot x\left(n + \frac{3-i-j-m_2-r_s}{2}\right) \cdot K_2\left(\left|x\left(n + \frac{1-i-j-r_s}{2}\right)\right|\right)$$

The output signals of the FIR filter$_0$ 107a, the FIR filter$_1$ 107b, and the FIR filter$_2$ 107c are eventually added by an adder 108. The result of the addition by the adder 108 corresponds to the equation (20) in the DPD 1 according to Patent Literature 3 illustrated in FIG. 9 and is output from the DPD 1 as a polynomial with a reduced number of coefficients expressed by the following equation (23) in the DPD 1 according to the present example embodiment.

$$y\left(n - \frac{i}{2} - \frac{j}{2}\right) = \sum_{l_s=0}^{2}\sum_{r_s=0}^{4} W_{l_s, r_s} \cdot x\left(n + \frac{3-i-j-m_{l_s}-r_s}{2}\right) \cdot \quad (23)$$

$$K_{l_s}\left(\left|x\left(n + \frac{3-i-j-l_s-r_s}{2}\right)\right|\right)$$

As described above, the DPD 1 according to the present example embodiment can freely select a value of a memory tap $m_{l_s}$ ($m_{l_s}$=0, 1, or 2) being identical to or different from a value of is for a path related to a memory tap $l_s$ ($l_s$=0, 1, or 2) by a polynomial structure including a multiplexer selecting a combination of sub-sample shift amounts and selection control on the multiplexer.

Accordingly, while being a distortion compensation apparatus not performing DPD upsampling processing in a previous stage of the DPD 1 and operating at a low sampling rate, the distortion compensation apparatus according to the present example embodiment can reduce an amount of coefficient calculation and can reduce the operating frequency of the DPD 1 and the sampling rates of the DA converter 2 and the AD converter 7, compared with the upsampling distortion compensation apparatus according to the related art. Furthermore, in compensation for a memory effect within a carrier band due to a sub-sample memory tap between sample points in the DPD 1, a degree of freedom can be given to a combination of complex-multiplication configurations based on cross terms with different memory taps (=sub-sample shift amounts) by a polynomial structure including a multiplexer selecting a combination of sub-sample shift amounts and selection control on the multiplexer, without increasing the number of coefficients and with a small amount of circuit addition. Therefore, a power amplifier model optimum for distortion compensation can be constructed, and target compensation performance can be achieved.

While various aspects of the present disclosure have been described above with reference to the example embodiments, the present disclosure is not limited to the aforementioned example embodiments. Various changes and modifications in each aspect of the present disclosure that may be understood by a person skilled in the art may be made to the configurations and details of the present invention within the scope of the present invention.

For example, the number of memory taps $l_s$ and $m_{l_s}$, and the number of FIR taps $r_s$ indicated in the aforementioned example embodiment are examples and are not restrictive. For example, while the number of memory taps $l_s$ and $m_{l_s}$ are set to 3, and the number of FIR taps $r_s$ is set to 5 as an example of approximating a seventh-order memory polynomial model in the aforementioned example embodiment, the seventh-order memory polynomial model may be approximated by setting the number of memory taps $l_s$ and $m_{l_s}$ to 5 and the number of FIR taps $r_s$ to 3. Further, permitting increase in the circuit size and the amount of coefficient calculation, the aforementioned number of taps may be increased.

This application claims priority based on Japanese Patent Application No. 2020-083960 filed on May 12, 2020, the disclosure of which is hereby incorporated by reference thereto in its entirety.

REFERENCE SIGNS LIST

1 DIGITAL PREDISTORTER (DPD)
2 DIGITAL/ANALOG (DA) CONVERTER
3 TRANSMISSION UPCONVERTER
4 POWER AMPLIFIER
5 DIRECTIONAL COUPLER
6 FEEDBACK DOWNCONVERTER
7 ANALOG/DIGITAL (AD) CONVERTER
101*a*, 101*b* PSEUDO-INTERPOLATION/SUB-SAMPLE-SHIFT FILTER
102 i/2-SAMPLE DELAY DEVICE
103 1-SAMPLE DELAY DEVICE
104*a*, 104*b*, 104*c* AMPLITUDE ADDRESS CALCULATION CIRCUIT
105*a*, 105*b*, 105*c* LOOK UP TABLE (LUT)
106*a*, 106*b*, 106*c* COMPLEX MULTIPLIER
107*a* FIR FILTER$_0$
107*b* FIR FILTER$_1$
107*c* FIR FILTER$_2$
108 ADDER
109*a* MULTIPLEXER$_0$
109*b* MULTIPLEXER$_1$
109*c* MULTIPLEXER$_2$
111 SUB-SAMPLE DELAY FILTER
112 (j/2−1)-SAMPLE DELAY DEVICE
113*a*, 113*b*, 113*c* 1-SAMPLE DELAY DEVICE
114*a*, 114*b*, 114*c*, 114*d*, 114*e* COMPLEX MULTIPLIER
115 ADDER
201, 202 HALF-BAND FILTER$_1$
203, 204 HALF-BAND FILTER$_2$
205 NUMERICAL CONTROLLED OSCILLATOR (NCO)
206, 207 COMPLEX MULTIPLIER
208 ADDER
209 DA CONVERSION UNIT

The invention claimed is:

1. A distortion compensation apparatus configured to compensate for non-linear distortion of a power amplifier, the distortion compensation apparatus comprising:
   an AD converter configured to feed back and analog/digital (AD) convert an output signal of the power amplifier and output the AD converted signal as a feedback signal;
   a digital predistorter configured to perform distortion compensation processing on an input signal by using the feedback signal and output the signal undergoing distortion compensation processing; and
   a DA converter configured to be provided between the digital predistorter and the power amplifier, digital/analog (DA) convert an output signal of the digital predistorter, and output the DA converted signal to the power amplifier,
   wherein the digital predistorter
      operates at a sampling rate for sampling the input signal not upsampled in a previous stage of the digital predistorter,
      includes:
         a polynomial structure configured to include a pseudo-interpolation/sub-sample-shift processor configured to pseudo-interpolate a first sample point between sample points of the input signal and shift the pseudo-interpolated first sample point by a sub-sample and include a multiplexer configured to select a combination of a sub-sample shift amount in complex-multiplication of a signal acquired by processing the input signal by the pseudo-interpolation/sub-sample-shift processor by an output of a look up table related to an amplitude address corresponding to an amplitude of the signal acquired by processing the input signal by the pseudo-interpolation/sub-sample-shift processor; and a finite impulse response (FIR) filter configured to be provided in a subsequent stage of the polynomial structure and include a sub-sample delay filter delaying a second sample point of the input signal by a sub-sample, and compensates for distortion due to a third sample point of the input signal and compensates for distortion due to the first sub-sample point between the sample points of the input signal, by using the polynomial structure and the FIR filter.

2. The distortion compensation apparatus according to claim 1, wherein
the digital predistorter
includes:
a plurality of the FIR filters; and
a first adder configured to add and output respective output signals of a plurality of the FIR filters, and
has a configuration in which a plurality of first paths of the polynomial structure are branched in parallel from an input stage of the digital predistorter, the plurality of the FIR filters are respectively placed in subsequent stages of the plurality of the first paths, and the first adder is placed in a subsequent stage of the plurality of the FIR filters, and
the pseudo-interpolation/sub-sample-shift processor is placed in one of the plurality of first paths.

3. The distortion compensation apparatus according to claim 2, wherein a plurality of the first paths include:
a path in which the pseudo-interpolation/sub-sample-shift processor is placed; and
a path in which the pseudo-interpolation/sub-sample-shift processor is not placed.

4. The distortion compensation apparatus according to claim 3, wherein
the pseudo-interpolation/sub-sample-shift processor is a filter with a fixed tap coefficient, and
a first delay device with an amount of delay determined by a number of taps of the pseudo-interpolation/sub-sample-shift processor is placed in the path in which the pseudo-interpolation/sub-sample-shift processor is not placed.

5. The distortion compensation apparatus according to claim 4, wherein the multiplexer selects the signal to be complex-multiplied by the output of the look up table from either an output of the pseudo-interpolation/sub-sample-shift processor in or plurality of the first paths or an output of the first delay device.

6. A distortion compensation method by a distortion compensation apparatus configured to compensate for non-linear distortion of a power amplifier, the distortion compensation method comprising:
in a digital predistorter, performing distortion compensation processing on an input signal by using a feedback signal acquired by feeding back and analog/digital (AD) converting an output signal of the power amplifier, and outputting the signal undergoing distortion compensation processing; and
digital/analog (DA) converting an output signal of the digital predistorter and outputting the DA converted signal to the power amplifier,
wherein the digital predistorter
operates at a sampling rate for sampling the input signal not upsampled in a previous stage of the digital predistorter,
includes:
a polynomial structure configured to include a pseudo-interpolation/sub-sample-shift processor configured to pseudo-interpolate a first sample point between sample points of the input signal and shift the pseudo-interpolated first sample point by a sub-sample and include a multiplexer configured to select a combination of a sub-sample shift amount in complex-multiplication of a signal acquired by processing the input signal by the pseudo-interpolation/sub-sample-shift processor by an output of a look up table related to an amplitude address corresponding to an amplitude of the signal acquired by processing the input signal by the pseudo-interpolation/sub-sample-shift processor; and
a finite impulse response (FIR) filter configured to be provided in a subsequent stage of the polynomial structure and include a sub-sample delay filter delaying a second sample point of the input signal by a sub-sample, and
compensates for distortion due to a third sample point of the input signal and compensates for distortion due to the first sub-sample point between the sample points of the input signal, by using the polynomial structure and the FIR filter.

* * * * *